(12) United States Patent
Lan et al.

(10) Patent No.: US 11,683,900 B2
(45) Date of Patent: Jun. 20, 2023

(54) POWER CONVERSION SYSTEM

(71) Applicant: Delta Electronics (Shanghai) CO., LTD, Shanghai (CN)

(72) Inventors: Lin Lan, Shanghai (CN); Weiqiang Zhang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 140 days.

(21) Appl. No.: 17/037,927

(22) Filed: Sep. 30, 2020

(65) Prior Publication Data
US 2021/0136944 A1     May 6, 2021

(30) Foreign Application Priority Data

Oct. 31, 2019   (CN) .......................... 201911056710.5

(51) Int. Cl.
*H05K 7/14*     (2006.01)
*H01F 27/24*    (2006.01)
(Continued)

(52) U.S. Cl.
CPC .............. *H05K 7/14* (2013.01); *H01F 27/24* (2013.01); *H01F 27/28* (2013.01); *H05K 5/0217* (2013.01); *H05K 7/20909* (2013.01)

(58) Field of Classification Search
CPC .... H05K 7/14; H05K 5/0217; H05K 7/20909; H01F 27/24; H01F 27/28
See application file for complete search history.

(56) References Cited

U.S. PATENT DOCUMENTS 3,851,287 A   11/1974   Miller et al.
4,464,544 A   8/1984    Klein
(Continued)

FOREIGN PATENT DOCUMENTS

CN   101710793 A   5/2010
CN   102158057 A   8/2011
(Continued)

OTHER PUBLICATIONS

Zhang. Xin-Yi, "High Frequency Power Device for Uniformly Outputting Multiple Groups of Current", May 19, 2010, Entire Document (translation of CN 101710793) (Year: 2010).*

(Continued)

*Primary Examiner* — Jacob R Crum
(74) *Attorney, Agent, or Firm* — Qinghong Xu

(57) ABSTRACT

The present disclosure relates to the field of power electronics, and proposes a power conversion system, including a power cabinet, a first divider and a plurality of power modules. The power cabinet includes a first high voltage compartment and a first low voltage compartment. The first divider is arranged in the power cabinet, and extends along a height direction of the power cabinet to separate the first high voltage compartment and the first low voltage compartment. The plurality of power modules are arranged in the power cabinet, each power module includes a high voltage input terminal and a low voltage output terminal; the high voltage input terminal is arranged in the first high voltage compartment, and the low voltage output terminal is arranged in the first low voltage compartment.

19 Claims, 40 Drawing Sheets

(51) Int. Cl.
*H05K 5/02* (2006.01)
*H05K 7/20* (2006.01)
*H01F 27/28* (2006.01)

(56) References Cited

U.S. PATENT DOCUMENTS

| | | | |
|---|---|---|---|
| 4,521,954 A * | 6/1985 | Rademaker | H01F 41/04 |
| | | | 29/605 |
| 4,660,014 A | 4/1987 | Wenaas et al. | |
| 5,025,489 A | 6/1991 | Yamaguchi | |
| 5,550,452 A | 8/1996 | Shirai et al. | |
| 2003/0213789 A1 | 11/2003 | Andersen | |
| 2005/0168942 A1 | 8/2005 | Steinbrecher | |
| 2008/0037219 A1 | 2/2008 | Chen et al. | |
| 2009/0159569 A1 * | 6/2009 | Ku | H02B 13/01 |
| | | | 218/157 |
| 2012/0126617 A1 | 5/2012 | Peng | |
| 2015/0223366 A1 * | 8/2015 | Horiuchi | H05K 7/2089 |
| | | | 361/689 |
| 2015/0245537 A1 | 8/2015 | Sakuma et al. | |
| 2015/0348694 A1 | 12/2015 | Sakuma et al. | |
| 2016/0037677 A1 | 2/2016 | Yamanaka et al. | |
| 2018/0323022 A1 * | 11/2018 | Skibinski | H02B 13/025 |
| 2020/0158354 A1 * | 5/2020 | Kurokawa | F24F 13/20 |
| 2020/0343033 A1 | 10/2020 | Ettl | |
| 2020/0350830 A1 * | 11/2020 | Hano | H02M 7/537 |
| 2021/0136944 A1 | 5/2021 | Lan et al. | |
| 2021/0167430 A1 | 6/2021 | Silha et al. | |
| 2021/0219458 A1 * | 7/2021 | Yan | H01F 27/025 |

FOREIGN PATENT DOCUMENTS

| | | |
|---|---|---|
| CN | 202840910 U | 3/2013 |
| CN | 203251558 U | 10/2013 |
| CN | 203377798 U | 1/2014 |
| CN | 104052292 A | 9/2014 |
| CN | 204578343 U | 8/2015 |
| CN | 205050689 U | 2/2016 |
| CN | 105810406 A | 7/2016 |
| CN | 205645692 U | 10/2016 |
| CN | 106098316 A | 11/2016 |
| CN | 106953502 A | 7/2017 |
| CN | 107666235 A | 2/2018 |
| CN | 207638544 U | 7/2018 |
| CN | 207852449 U | 9/2018 |
| CN | 208027854 U | 10/2018 |
| CN | 108831716 A | 11/2018 |
| CN | 109861557 A | 6/2019 |
| CN | 209267423 U | 8/2019 |
| EP | 0794098 A1 | 9/1997 |
| EP | 1220574 A2 | 7/2002 |
| EP | 2487697 A1 | 8/2012 |
| JP | 2016082602 A | 5/2016 |
| TW | 201113913 A | 4/2011 |
| WO | 2004055965 A1 | 7/2004 |

OTHER PUBLICATIONS

Wu, Tao, "A Cascade Type High-Voltage System", Jun. 7, 2019, Entire Document (translation of CN 109861557) (Year: 2019).*
The Extended European Search Report dated Mar. 19, 2021 from EP patent application No. 20204365.9.
The 1st Office Action dated Oct. 11, 2021 for CN patent application No. 201911056698.8.
The Notice of Allowance dated Oct. 11, 2021 for CN patent application No. 201911055495.7.
The 1st Office Action dated Dec. 1, 2021 for CN patent application No. 201911056710.5.
Non-Final Rejection dated Apr. 8, 2022 of U.S. Appl. No. 17/077,381.
Non-Final Rejection dated Mar. 15, 2023 of U.S. Appl. No. 17/011,135.

* cited by examiner

POWER CONVERSION SYSTEM

This application claims priority to Chinese patent application No. 201911056710.5 filed on Oct. 31, 2019, the entire contents of which are incorporated herein by reference.

TECHNICAL FIELD

The present disclosure relates to the field of power electronics, and in particular, to a power conversion system.

BACKGROUND

In existing power cabinets, high and low voltage components are mixedly mounted. To meet requirements of electric clearance and creepage distance between the high and low voltage components, large space is required, and there are many insulating components between the high and low voltage components. Moreover, the power cabinets and power modules have a large size, heavy weight, and low power density. In the mixed arrangement of the high and low voltage components, connection wires of high and low voltage components crisscross, resulting in complicated protection of low voltage wires, routing and assembling schemes and high production and assembly costs.

SUMMARY

A primary objective of the present disclosure is to provide a power conversion system to overcome at least one of the above deficiencies in related arts.

According to a first aspect of the present disclosure, there is provided a power conversion system, including:

a power cabinet comprising a first high voltage compartment and a first low voltage compartment;

a first divider arranged in the power cabinet and extending along a height direction of the power cabinet to separate the first high voltage compartment and the first low voltage compartment; and a plurality of power modules arranged in the power cabinet, each of plurality of power modules comprising a high voltage input terminal and a low voltage output terminal;

wherein the high voltage input terminal is arranged in the first high voltage compartment, and the low voltage output terminal is arranged in the first low voltage compartment.

According to an exemplary embodiment, the first divider is provided with through holes, and the power modules are arranged in the through holes;

circumferential outer surfaces of the power modules and hole walls of the through holes are sealed.

According to an exemplary embodiment, the power conversion system further includes:

input busbars arranged in the first high voltage compartment and electrically connected to high voltage input terminals; and output busbars arranged in the first low voltage compartment and electrically connected to low voltage output terminals.

According to an exemplary embodiment, the power conversion system further includes:

a plurality of isolation plates arranged along the height direction of the power cabinet and spaced from each other, wherein the plurality of isolation plates are arranged between the power modules and a bottom of the power cabinet and between the power modules and a top of the power cabinet.

According to an exemplary embodiment, the power conversion system is a multi-phase power conversion system with the isolation plates arranged between two adjacent power modules in different phases.

According to an exemplary embodiment, at least a part of each of the isolation plates is located within the first high voltage compartment According to an exemplary embodiment, the isolation plates are insulating plates.

According to an exemplary embodiment, the isolation plates are connected to the power cabinet or the first divider.

According to an exemplary embodiment, the power conversion system further includes:

a system blower arranged at a top of the power cabinet, wherein an air opening of the system blower is in communication with the first high voltage compartment.

According to an exemplary embodiment, the power conversion system further includes:

an input-output cabinet comprising a second high voltage compartment and a second low voltage compartment;

a second divider arranged in the input-output cabinet and extending along a height direction of the input-output cabinet to separate the second high voltage compartment from the second low voltage compartment;

a system input portion arranged in the second high voltage compartment;

a system output portion; and a control portion, wherein the system output portion and the control portion are arranged in the second low voltage compartment;

the second high voltage compartment is in communication with the first high voltage compartment.

According to an exemplary embodiment, the input-output cabinet and the power cabinet are spliced together, or integrally formed.

According to an exemplary embodiment, the second divider and the first divider are spliced together or integrally formed.

According to an exemplary embodiment, each of the power modules further includes:

a high voltage power unit comprising the high voltage input terminal;

a low voltage power unit comprising the low voltage output terminal;

a body, wherein the high voltage power unit and the low voltage power unit being both arranged in the body; and a third divider, wherein the high voltage power unit and the low voltage power unit are arranged on both sides of the third divider.

According to an exemplary embodiment, each of the power modules further includes:

a first air passage and a second air passage in the body which are separated by the third divider, wherein the first air passage and the second air passage are continuous air passages and stacked with each other;

a transformer comprising a high voltage portion and a low voltage portion, the high voltage portion comprising a first magnetic core and a high voltage coil provided on the first magnetic core; and the low voltage portion comprising a second magnetic core and a low voltage coil provided on the second magnetic core;

the high voltage power unit and the high voltage portion are arranged in the first air passage, the low voltage power unit and the low voltage portion are arranged in the second air passage; and the high voltage coil is electrically connected to the high voltage power unit, and the low voltage coil is electrically connected to the low voltage power unit.

According to an exemplary embodiment, each of the power modules further includes:

a first modular blower, wherein an air opening of the first modular blower is in communication with both a front portion of the first air passage and a front portion of the second air passage.

According to an exemplary embodiment, the third divider is a bent plate, and the high voltage power unit and the low voltage power unit are sequentially arranged along a length direction of the body.

According to an exemplary embodiment, the body includes a first housing and a second housing which are connected with each other along a length direction of the body;

the first housing is an insulating housing, the second housing is a metal housing, and the high voltage power unit and the low voltage power unit are arranged in the first housing and the second housing, respectively, and are arranged on both sides of the third divider.

According to an exemplary embodiment, each of the power modules further includes a transformer which is electrically connected to the high voltage power unit and the low voltage power unit;

the transformer and the high voltage power unit are stacked upon each other, or the transformer and the low voltage power unit are stacked upon each other.

According to an exemplary embodiment, each of the power modules further includes:

a second modular blower arranged on a side of the second housing away from the first housing;

an air opening of the second modular blower is in communication with an interior of the second housing.

According to an exemplary embodiment, the high voltage input terminal protrudes from left and right sides of the body or a rear portion of the body; the low voltage output terminal protrudes from a top surface of the body or a bottom surface of the body.

BRIEF DESCRIPTION OF THE DRAWINGS

Various objectives, features and advantages of the present disclosure will become more apparent from the following detailed description of exemplary embodiments of the present disclosure in conjunction with the accompanying drawings. The drawings are merely schematic representations of the present disclosure and are not necessarily drawn to scale. The same reference numerals in the drawings denote the same or similar parts.

Figure 1:
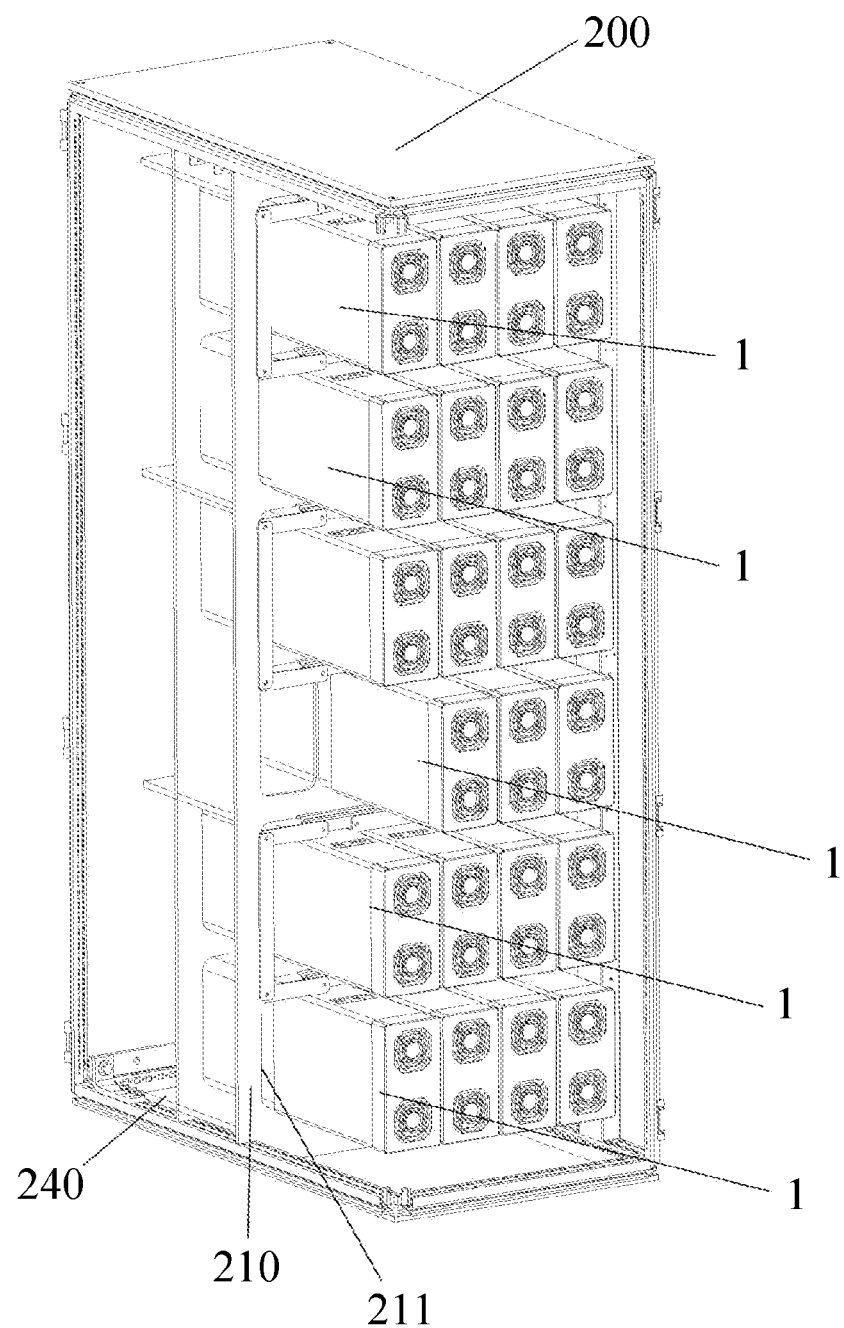
FIG. 1 is a schematic diagram showing an internal structure of a power conversion system from a first view according to an exemplary embodiment.

LISTING OF REFERENCE NUMERALS 1, power module;
10, body; 11, first air passage; 12, second air passage; 20, high voltage power unit; 21, high voltage input terminal; 30, low voltage power unit; 31, low voltage output terminal; 40, transformer; 41, high voltage portion; 41-A, main high voltage portion; 41-B, auxiliary high voltage portion; 411, first magnetic core; 411-A, first main magnetic core; 411-B, first auxiliary electromagnetic core; 412, high voltage coil; 412-A, main high voltage coil; 412-B, auxiliary high voltage coil; 42, low voltage portion; 42-A, main low voltage portion; 42-B, auxiliary low voltage portion; 421, second magnetic core; 421-A, second main magnetic core; 421-B, second auxiliary magnetic core; 422, low voltage coil; 422-A, main low voltage coil; 422-B, auxiliary low voltage coil; 43, main transformer; 44, auxiliary transformer; 50, third divider; 51, first plate; 52, second plate; 53, third plate; 60, a semiconductive layer; 70, first modular blower; 71, first blower; 72, second blower; 73, air deflector; 74, mounting portion; 741, vent; 80, fourth divider; 81, fifth divider; 90, sixth divider; 100, body; 101, first housing; 102, second housing; 103, creepage structure; 104, insulating layer; 110, third divider; 111, holes; 112, cooling vent; 120, high voltage power unit; 121, high voltage input terminal; 130, low voltage power unit; 131, low voltage output terminal; 140, transformer; 150, second modular blower; 151, blower; 152, mounting housing; 200, power cabinet; 201, first high voltage compartment; 202, first low voltage compartment; 203, input-output cabinet; 204, second high voltage compartment; 205, second low voltage compartment; 206, second divider; 210, first divider; 211, through hole; 220, input busbar; 230, output busbar; 240, isolation plate; 250, system blower; 260, control portion; 261, system input portion; 262, system output portion.

DETAILED DESCRIPTION

Features and advantages of the present disclosure will become apparent from the following description. It should be understood that the present disclosure can have various changes without departing from the scope of the present disclosure, and the descriptions and drawings are provided for the purpose of illustration, rather than limiting the present disclosure.

In the following description of different exemplary embodiments of the present disclosure, reference is made to the accompanying drawings, which form a part of the present disclosure, and various exemplary structures, systems and steps are shown by way of example, which may implement various aspects of the present disclosure. It should be understood that other specific schemes of components, structures, exemplary devices, systems, and steps may be used, and structural and functional modifications may be made without departing from the scope of the present disclosure. Moreover, although the terms "over", "between", "within", and the like may be used in this specification to describe various exemplary features and elements of the present disclosure, these terms are used based on the orientations of examples in the drawings.

Embodiments of the present disclosure provide a power conversion system. Referring to FIG. 1 to FIG. 40, the power conversion system includes: a power cabinet 200, including a first high voltage compartment 201 and a first low voltage compartment 202; a first divider 210 arranged in the power cabinet 200 and extending along a height direction of the power cabinet 200 to separate the first high voltage compartment 201 and the first low voltage compartment 202; and a plurality of power modules 1 arranged in the power cabinet 200, each power module 1 including a high voltage input terminal and a low voltage output terminal. The high voltage input terminal is arranged in the first high voltage compartment 201, and the low voltage output terminal is arranged in the first low voltage compartment 202.

In the power conversion system of the embodiment of the present disclosure, high voltage input terminals and low voltage output terminals of the plurality of power modules 1 are arranged in the first high voltage compartment 201 and the first low voltage compartment 202, respectively, and the first divider 210 separates the first high voltage compartment 201 from the first low voltage compartment 202. In this way, connections between the high voltage input terminals and the low voltage output terminals become more convenient, and thus the internal wiring of the power conversion system is simpler.

In one embodiment, the plurality of power modules 1 are arranged in a plurality of ways. That is, a portion of the plurality of power modules may be arranged along the vertical direction, and a portion of the plurality of power modules may be arranged along the horizontal direction.

As shown in FIG. 1, the first divider 210 is provided with through holes 211, and the power modules 1 are arranged through the through holes 211. The circumferential outer surfaces of the power modules 1 are sealed with hole walls of the through holes 211, e.g., the circumferential outer surfaces of the power modules 1 are adhered to hole walls of the through holes 211 through a sealing member. The power modules 1 are inserted in the through holes 211, so that the high voltage input terminal and the low voltage output terminal of each power module 1 are located in the first high voltage compartment 201 and the first low voltage compartment 202, respectively. The first divider 210 can realize the isolation of the high voltage and the low voltage.

In one embodiment, as shown in FIGS. 4 to 13, the power conversion system further includes: input busbars 220 located in the first high voltage compartment 201 and electrically connected to the high voltage input terminals;

and output busbars 230 located in the first low voltage compartment 202 and electrically connected to the low voltage output terminals.

Figure 3:
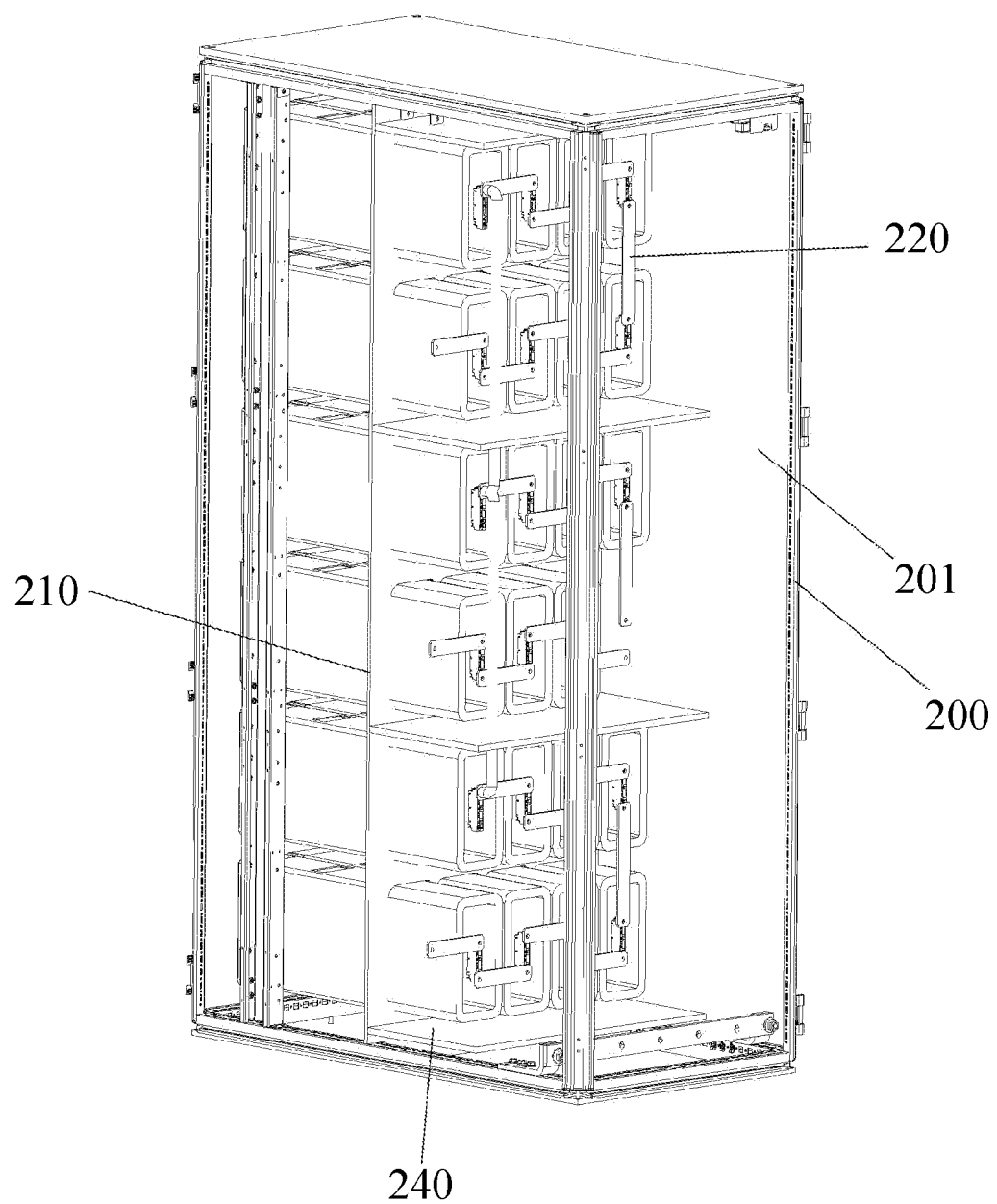
FIG. 3 is a schematic diagram showing an internal structure of a power conversion system from a first view according to an exemplary embodiment.
Figure 4:
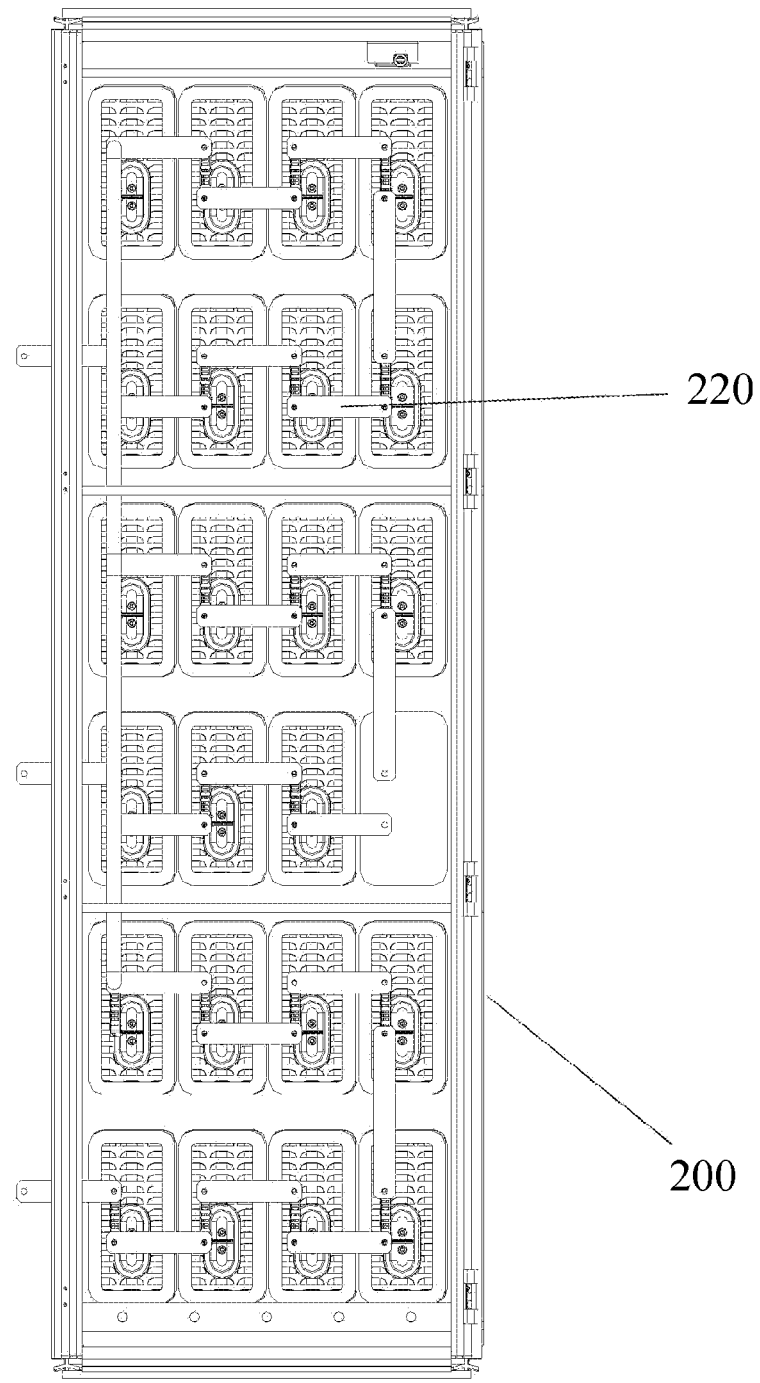
FIG. 4 is a schematic diagram showing an internal structure of a power conversion system from a second view according to an exemplary embodiment.
Figure 5:
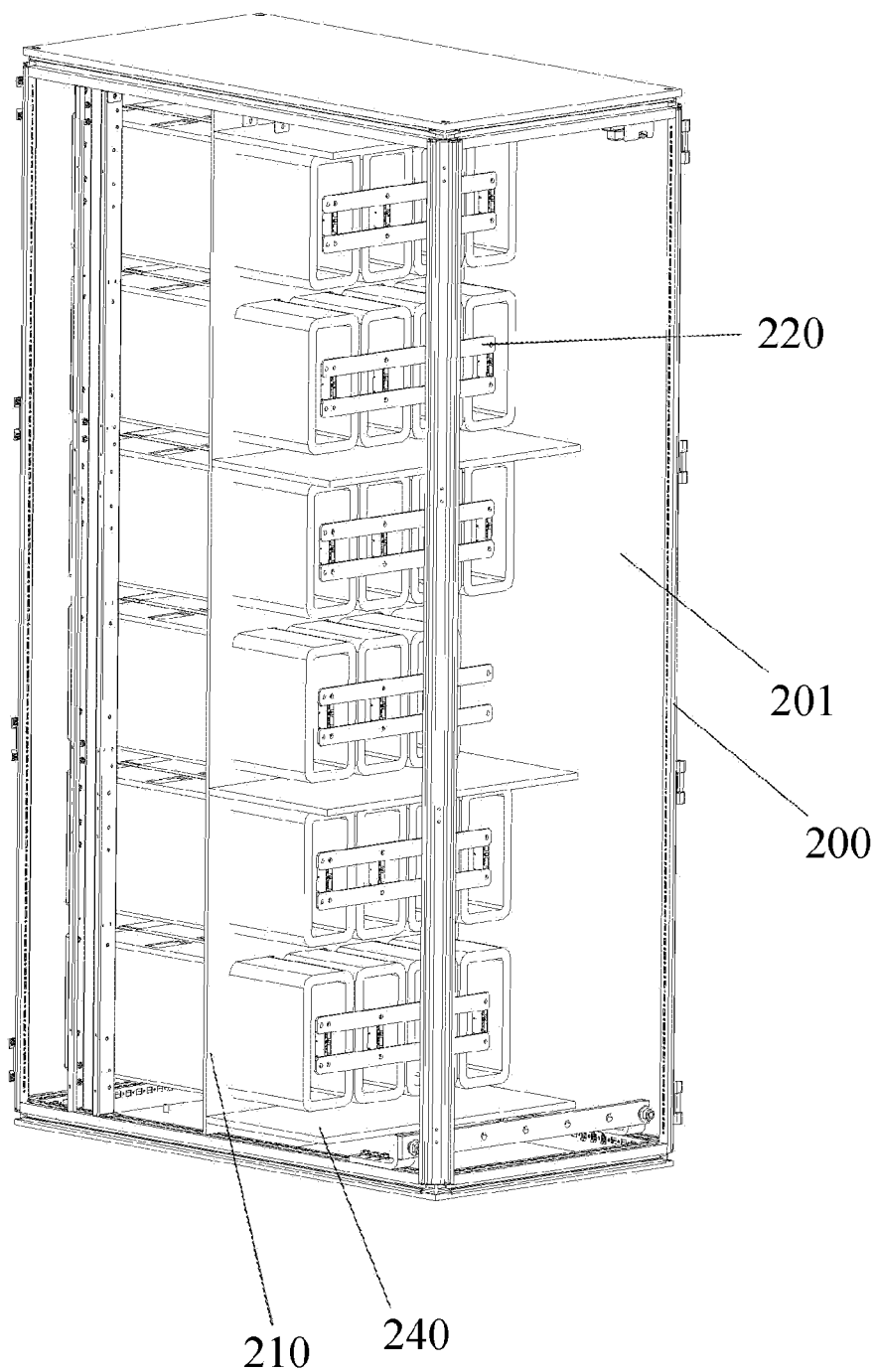
FIG. 5 is a schematic diagram showing an internal structure of a power conversion system from a first view according to an exemplary embodiment.
Figure 6:
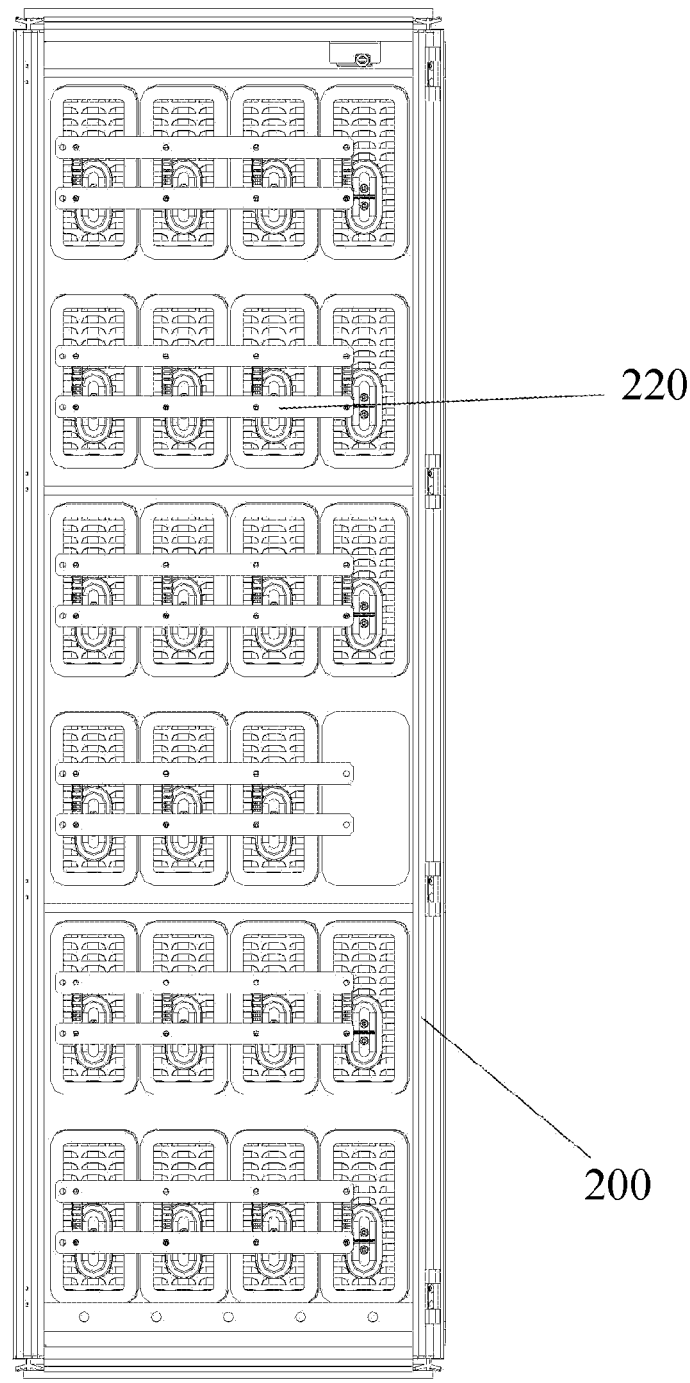
FIG. 6 is a schematic diagram showing an internal structure of a power conversion system from a second view according to an exemplary embodiment.

In one embodiment, as shown in FIGS. 3 and 4, a plurality of input busbars 220 in the first high voltage compartment 201 are arranged in series. Alternatively, as shown in FIGS. 5 and 6, the plurality of the input busbars 220 in the first high voltage compartment 201 are arranged in parallel. The input busbars 220 are copper bars which are fixed on the power cabinet 200.

Figure 7:
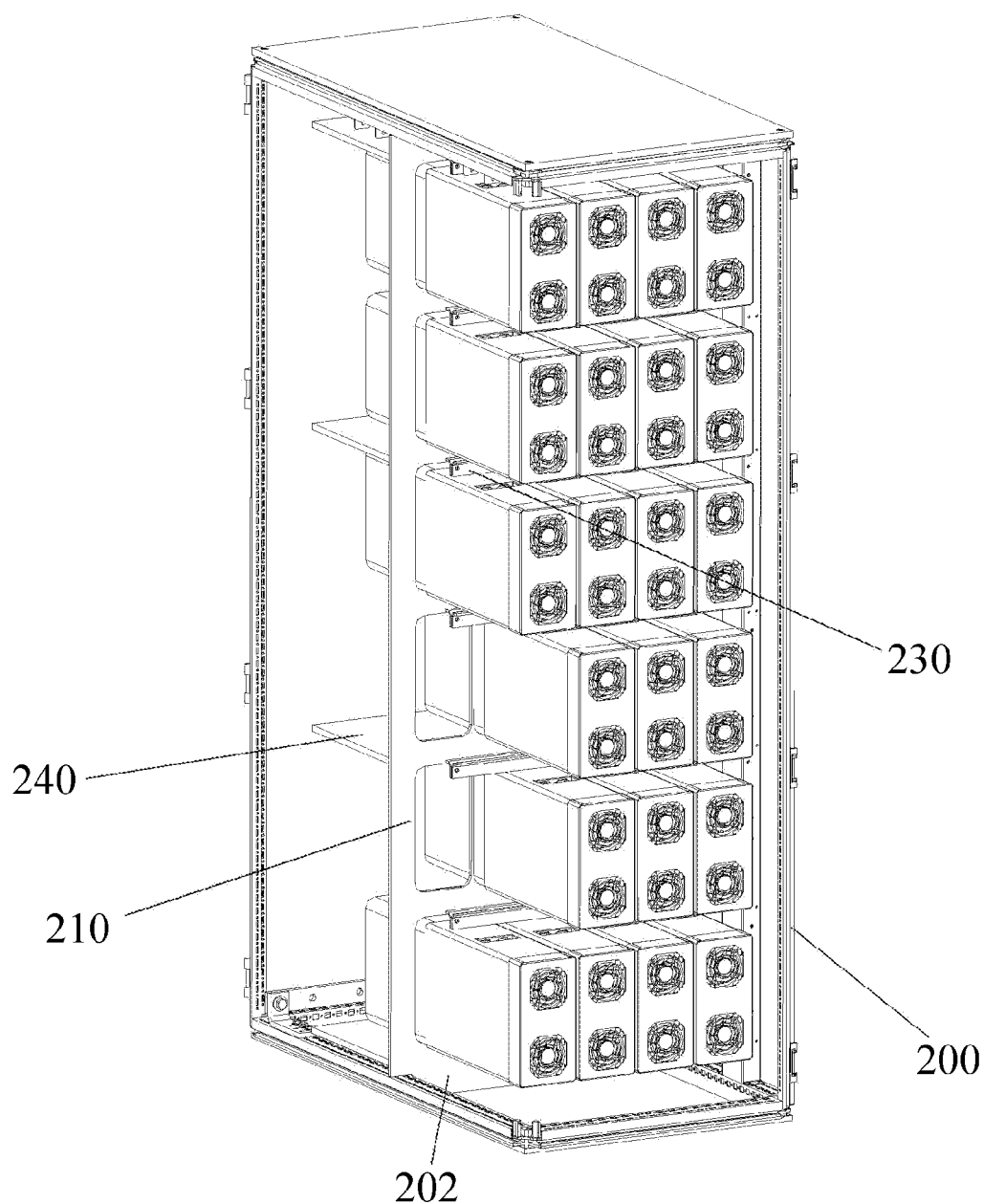
FIG. 7 is a schematic diagram showing an internal structure of a power conversion system from a first view according to an exemplary embodiment.
Figure 8:
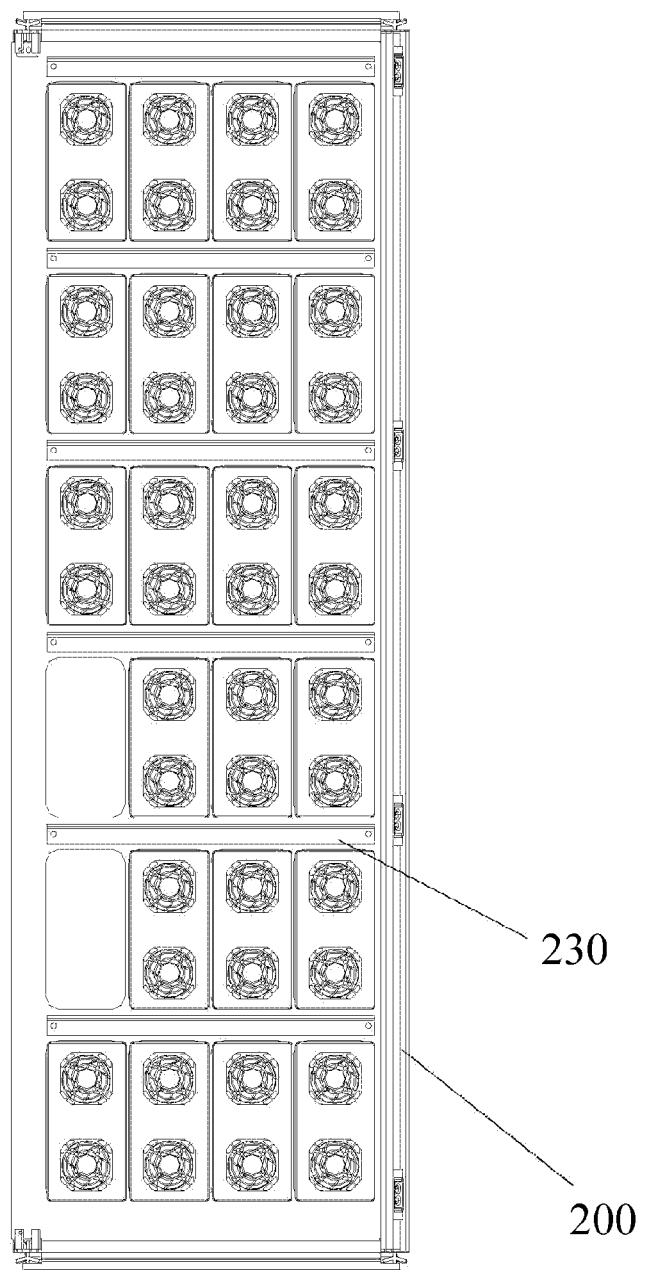
FIG. 8 is a schematic diagram showing an internal structure of a power conversion system from a second view according to an exemplary embodiment.
Figure 9:
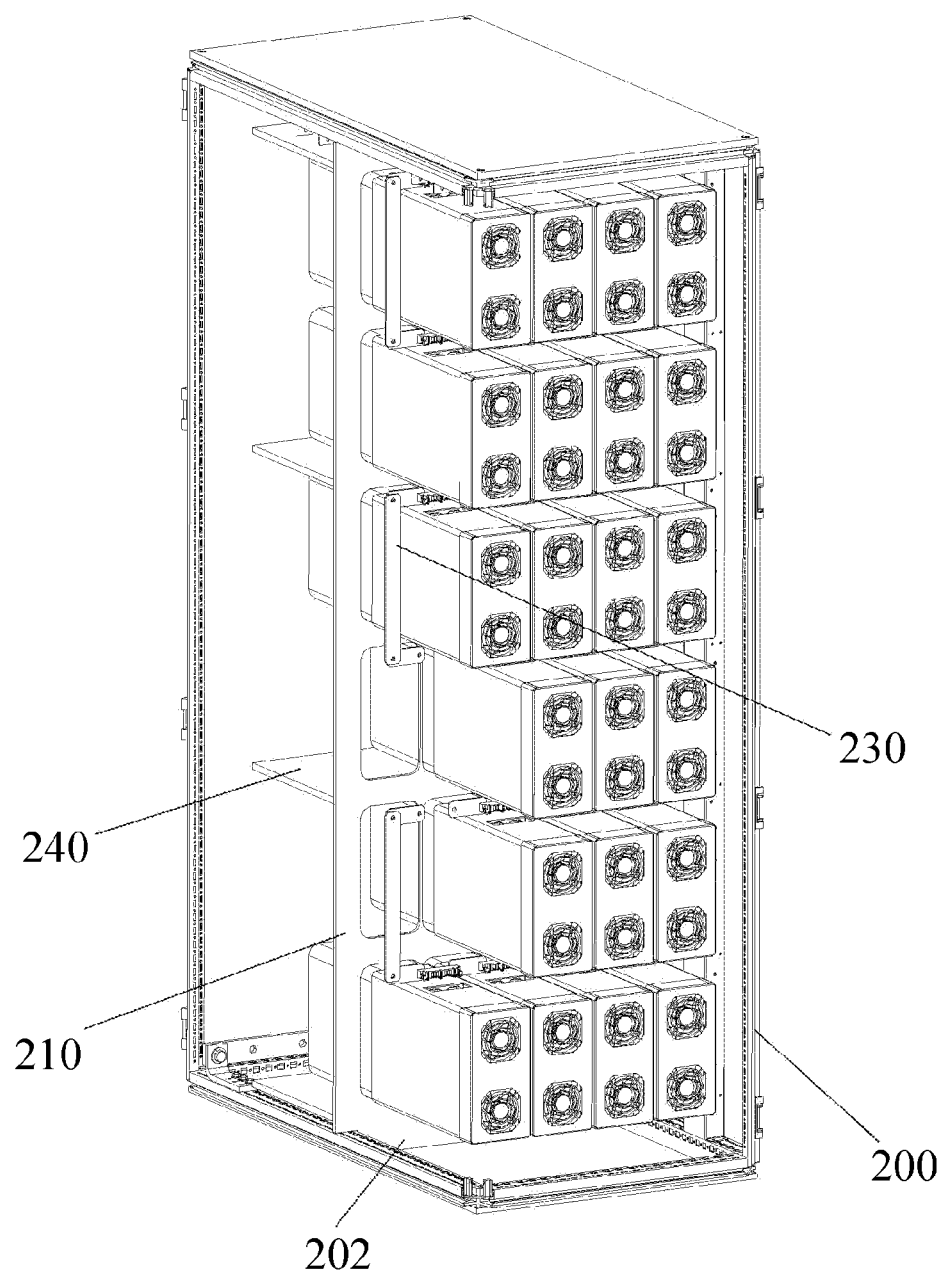
FIG. 9 is a schematic diagram showing an internal structure of a power conversion system from a first view according to according to an exemplary embodiment.
Figure 10:
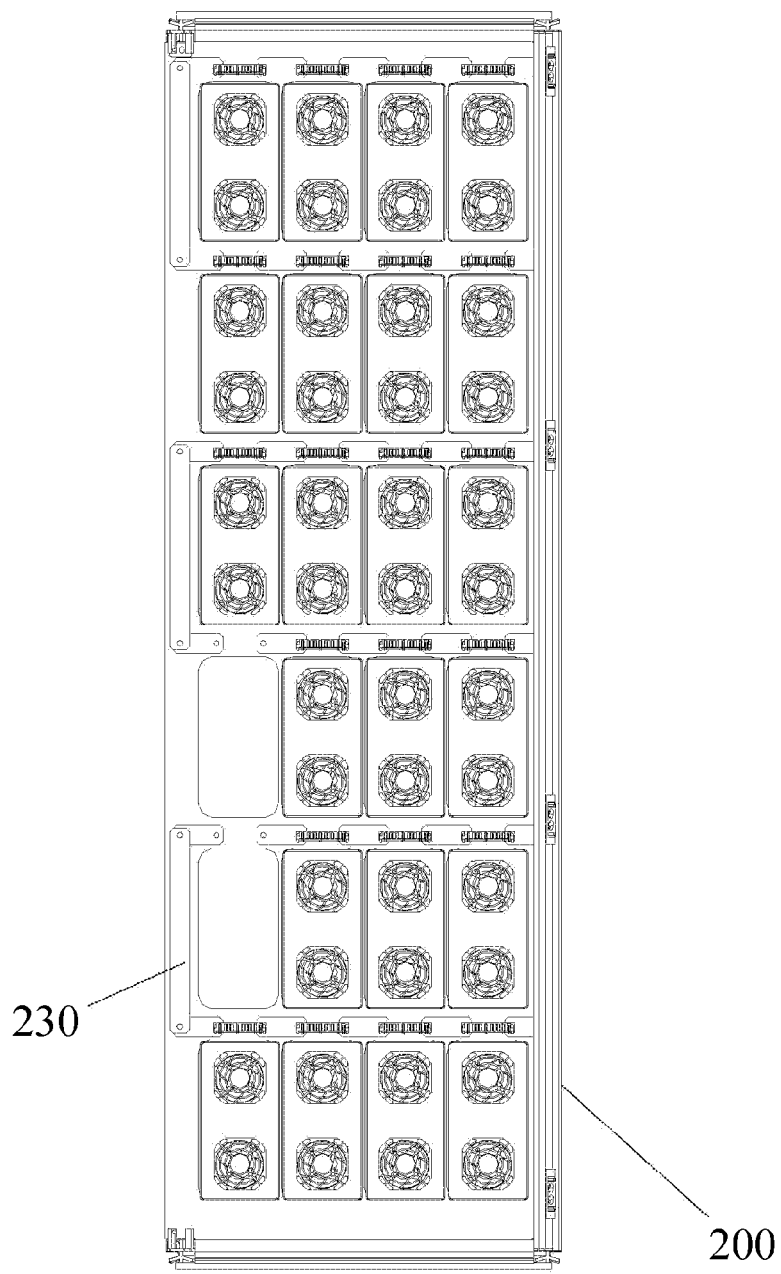
FIG. 10 is a schematic diagram showing an internal structure of a power conversion system from a second view according to according to an exemplary embodiment.
Figure 11:
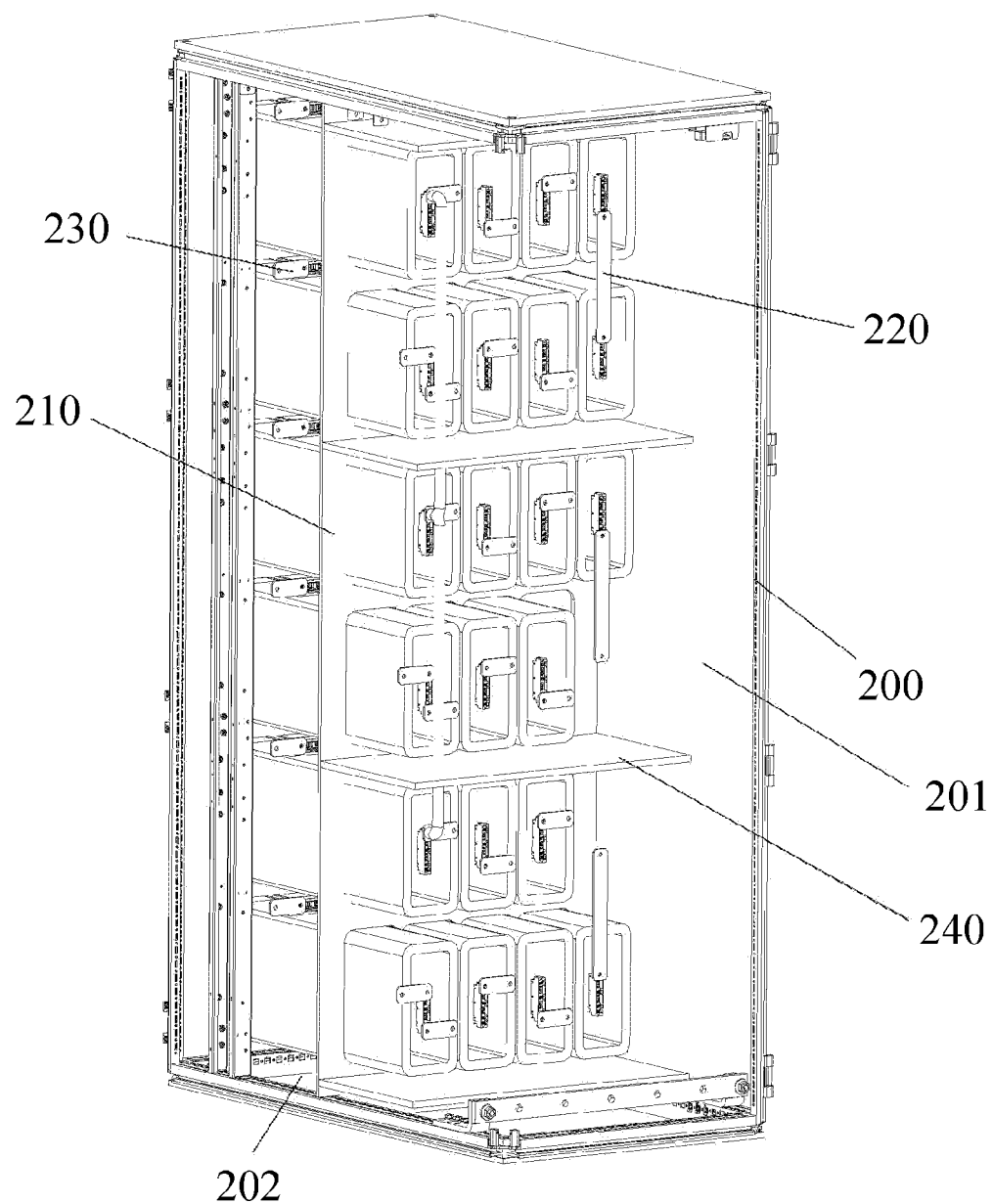
FIG. 11 is a schematic diagram showing an internal structure of a power conversion system from a first view according to an exemplary embodiment.
Figure 12:
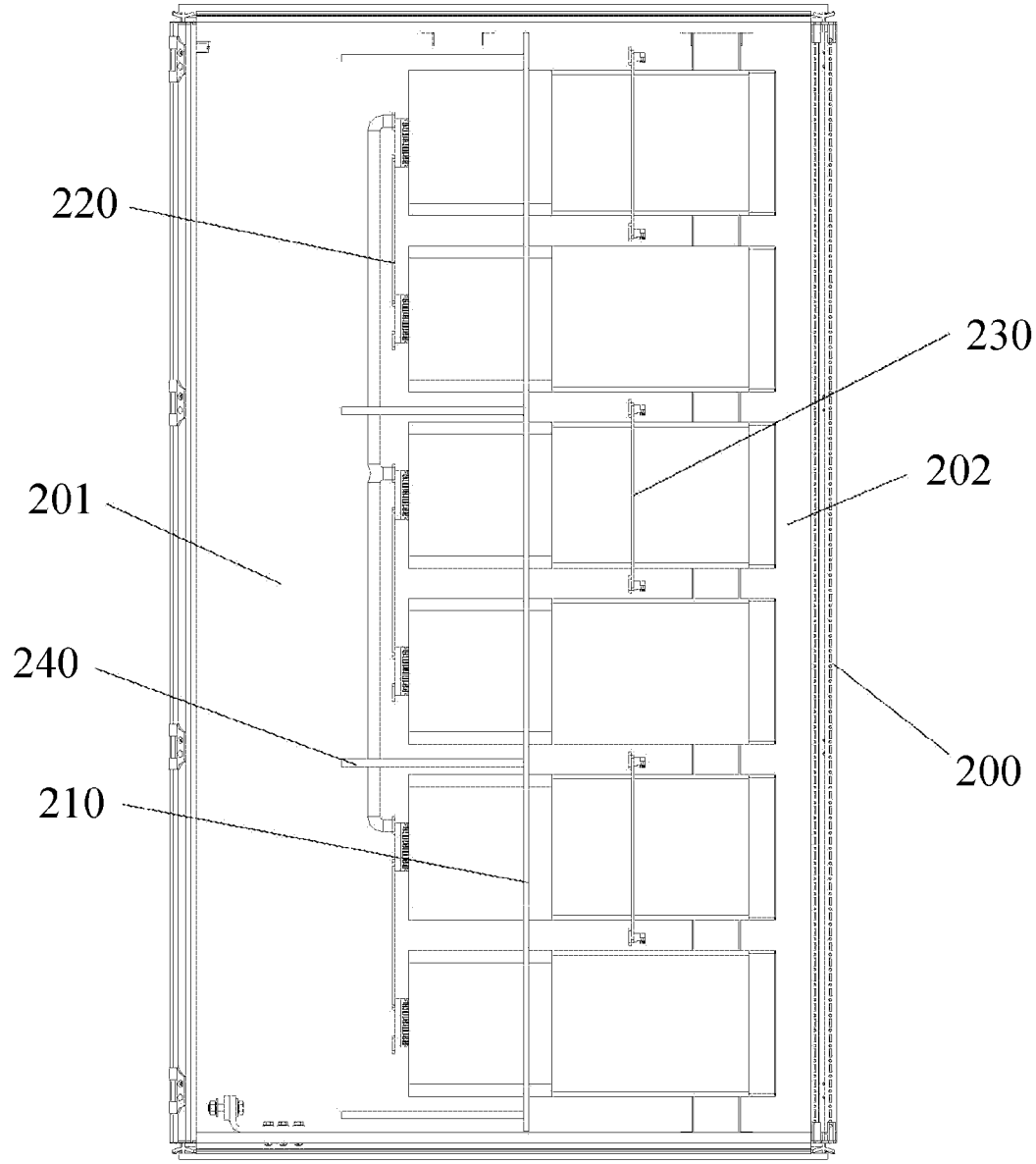
FIG. 12 is a schematic diagram showing an internal structure of a power conversion system from a second view according to an exemplary embodiment.

In one embodiment, as shown in FIGS. 7 and 8, a plurality of output busbars 230 in the first low voltage compartment 202 are arranged in parallel. Alternatively, as shown in FIGS. 9 and 10, the plurality of output busbars 230 in the first low voltage compartment 202 are arranged in parallel. The output busbars 230 are copper bars which are fixed on the power cabinet 200.

Figure 2:
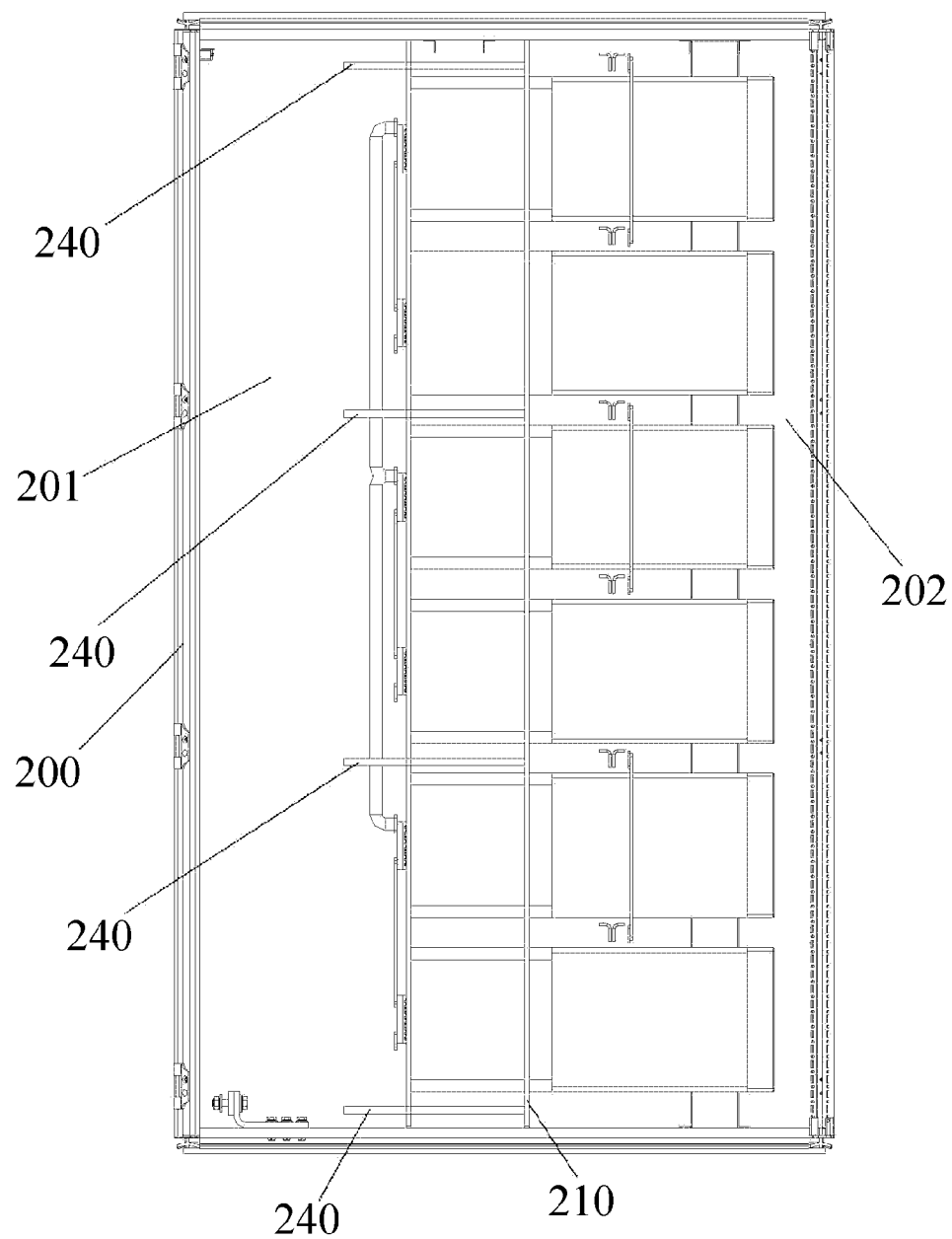
FIG. 2 is a schematic diagram showing an internal structure of a power conversion system from a second view according to an exemplary embodiment.

As shown in FIG. 2, the power conversion system further includes a plurality of isolation plates 240 arranged along the height direction of the power cabinet 200 and spaced from each other. The plurality of isolation plates are respectively arranged between the power modules 1 and a bottom of the power cabinet 200 and between the power modules 1 and a top of the power cabinet 200.

In one embodiment, the power conversion system is a multi-phase power conversion system with the isolation plates 240 arranged between two adjacent power modules 1 in different phases.

In one embodiment, at least a portion of each of the isolation plates 240 is located within the first high voltage compartment 201.

In one embodiment, the isolation plates 240 are insulating plates.

In one embodiment, the isolation plates 240 are connected to the power cabinet 200 or the first divider 210.

In one embodiment, the plurality of isolation plates 240 are arranged in the first high voltage compartment 201. Each isolation plate 240 is made of an insulating material and may be fixed on the power cabinet 200 or may be fixed on the first divider 210. The isolation plates 240 may be located between two adjacent power modules 1 in different phases, and between the power modules 1 and the power cabinet 200. The isolation plates isolate phases on the high voltage side and isolates the phases from the ground, thereby reducing the space required for meeting the requirements of the electrical clearance and the creepage distance and the size of the cabinet, and making different input voltage levels compatible, such as 4.8~22 KV.

Figure 13:
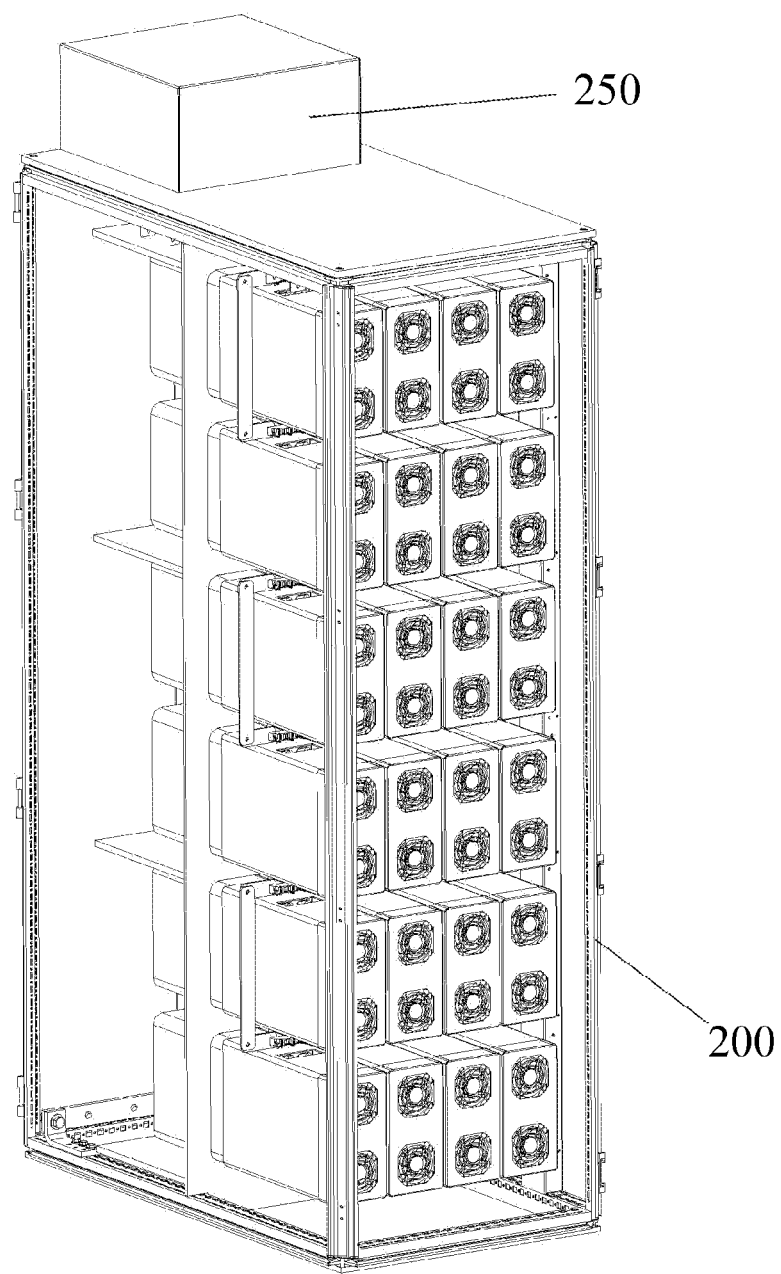
FIG. 13 is a schematic diagram showing an internal structure of a power conversion system from a first view according to an exemplary embodiment.
Figure 14:
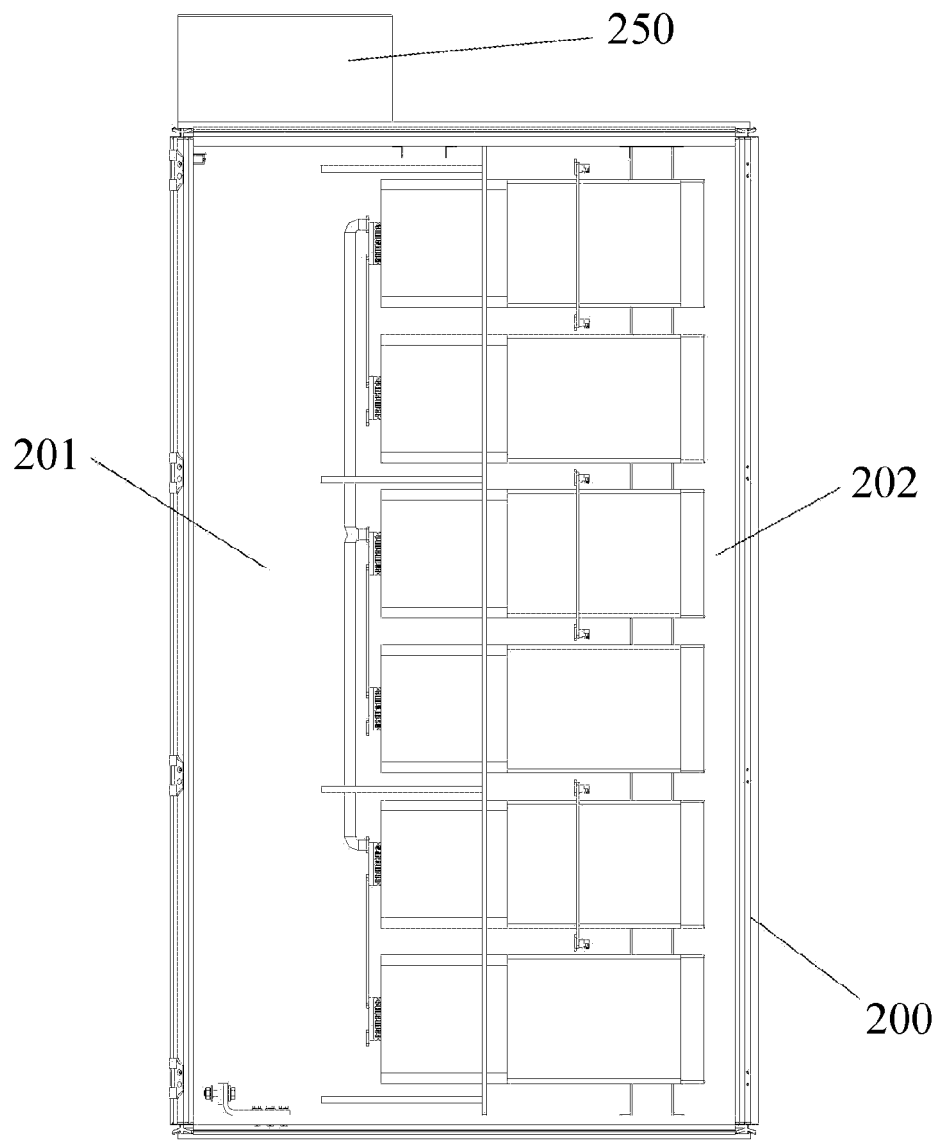
FIG. 14 is a schematic diagram showing an internal structure of a power conversion system from a second view according to an exemplary embodiment.

As shown in FIG. 13 and FIG. 14, the power conversion system further includes a system blower 250 arranged on the top of the power cabinet 200, and an air opening of the system blower 250 communicates with the first high voltage compartment 201. The system blower 250 can improve the heat dissipation capability of the system and thereby increase power density.

Figure 15:
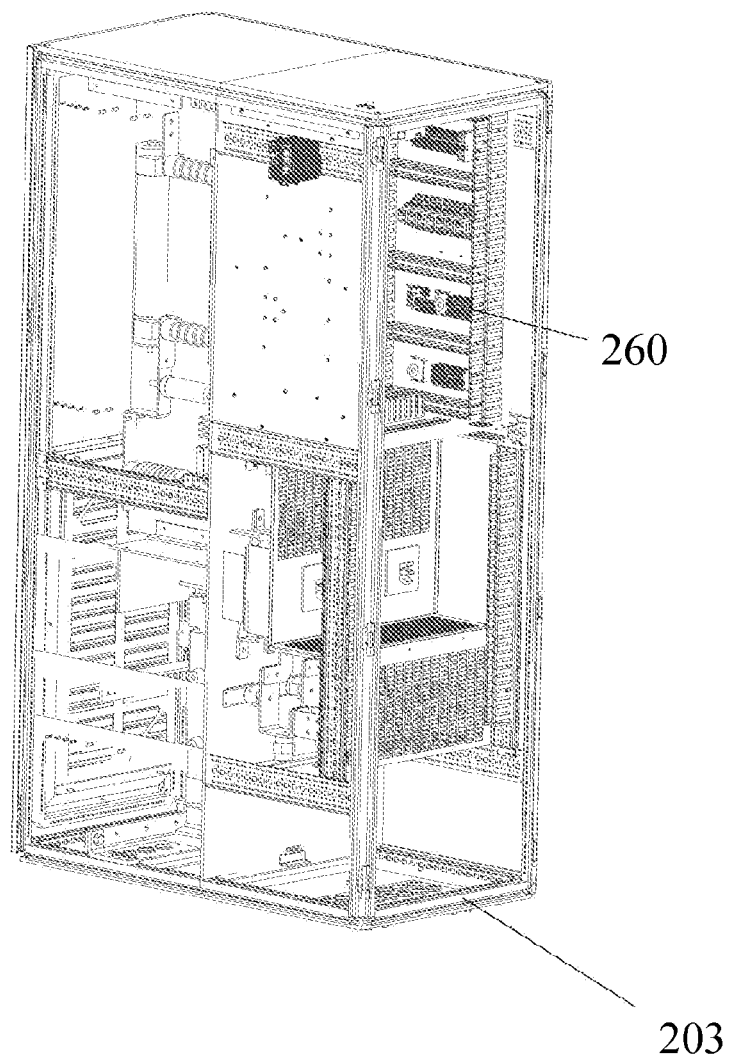
FIG. 15 is a schematic diagram showing an internal structure of an input-output cabinet of a power conversion system from a first view according to an exemplary embodiment.
Figure 16:
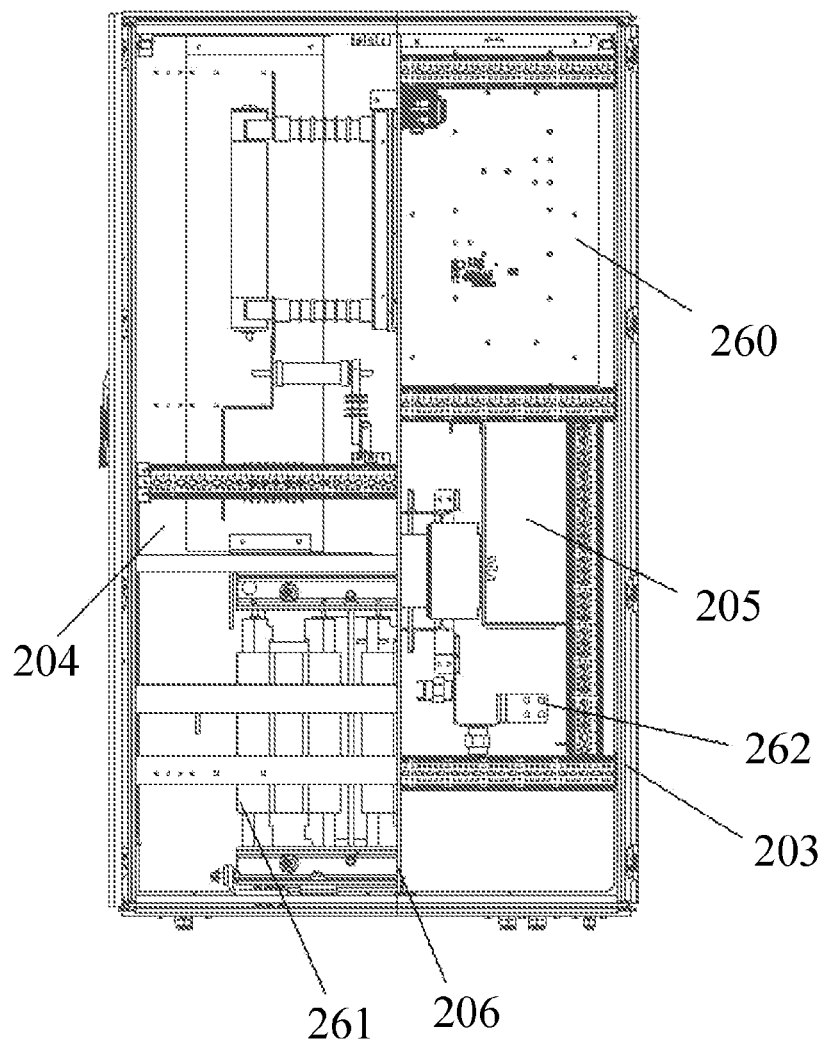
FIG. 16 is a schematic diagram showing an internal structure of an input-output cabinet of a power conversion system from a second view according to an exemplary embodiment.
Figure 17:
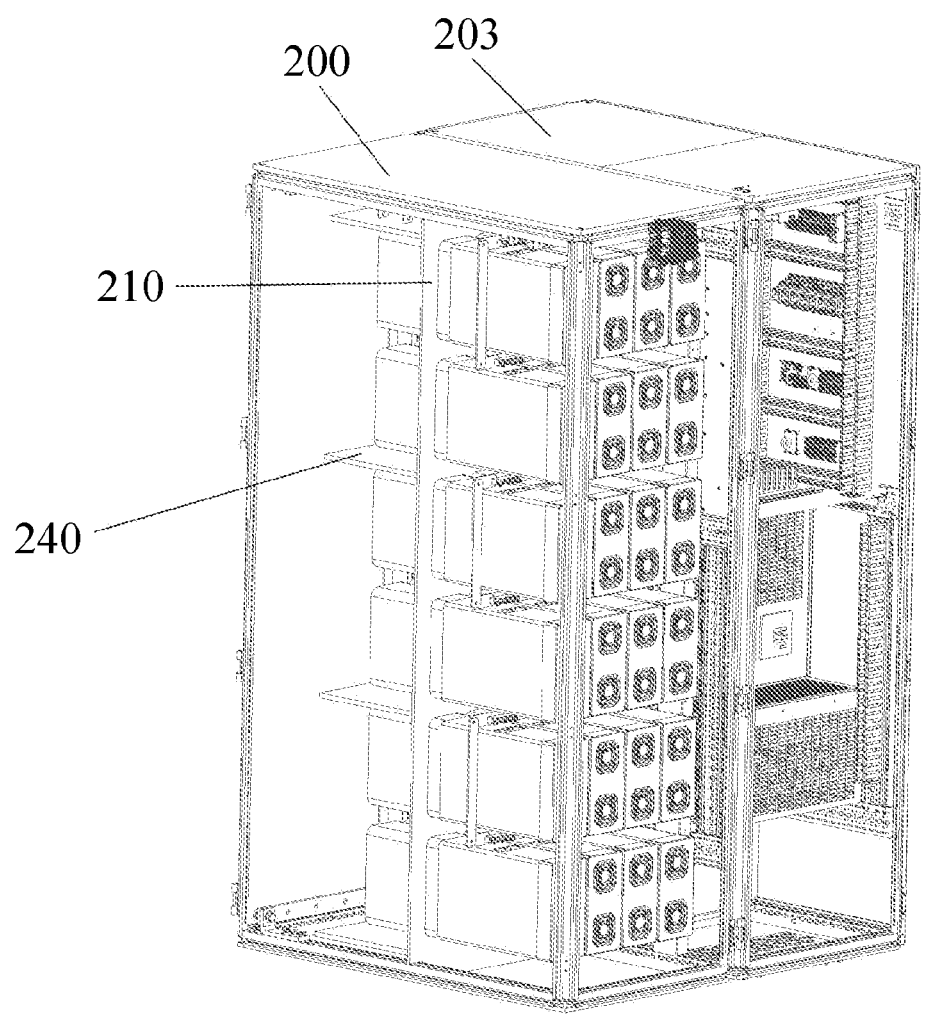
FIG. 17 is a schematic diagram showing an internal structure of a power conversion system according to an exemplary embodiment.

As shown in FIGS. 15 to 17, the power conversion system further includes: an input-output cabinet 203, including a second high voltage compartment 204 and a second low voltage compartment 205; a second divider 206 arranged in the input-output cabinet 203 and extending along a height direction of the input-output cabinet 203 to separate the second high voltage compartment 205 from the second low voltage compartment 206; a system input portion 261 arranged in the second high voltage compartment 204; a system output portion 262; and a control portion 260. The system output portion 262 and the control portion 260 are arranged in the second low voltage compartment 205. The second high voltage compartment 204 is in communication with the first high voltage compartment 201. The input-output cabinet 203 and the power cabinet 200 are spliced together or integrally formed. The second divider and the first divider 210 are spliced together or integrally formed.

In one embodiment, the input-output cabinet 203 is internally provided with a system input portion 261, a system output portion 262, and a control portion 260. The input-output cabinet 203 is separated by the second divider 206 into a second high voltage compartment 204 and a second low voltage compartment 205, and the second high voltage compartment 204 and the first high voltage compartment 201 are in communication to form one high voltage compartment, the second low voltage compartment 205 and the first low voltage compartment 202 are in communication to form one low voltage compartment. The system input portion 261 is arranged in the second high voltage compartment 204. The system output portion 262 and the control portion 260 are arranged in the second low voltage compartment 205. The input-output cabinet 203 and the power cabinet 200 may be formed by splicing two independent cabinets together or the input-output cabinet 203 and the power cabinet 200 may be integrally formed. Accordingly, the second divider 206 and the first divider 210 may be formed by splicing two independent plates together or the second divider 206 and the first divider 210 may be integrally formed. The system input portion 261, the system output portion 262, and the control portion 260 are integrated in the input-output cabinet 203 to improve the space utilization, thereby increasing the power density of the system. The power conversion system has one high voltage compartment, one low voltage compartment, and the high voltage components are located in the high voltage compartment, and the low voltage components are located in the low voltage compartment. Thus, the space required by the electrical clearance and creepage distance is reduced, and less isolation members for isolating the high and low voltage components are needed, and costs can be saved.

Figure 18:
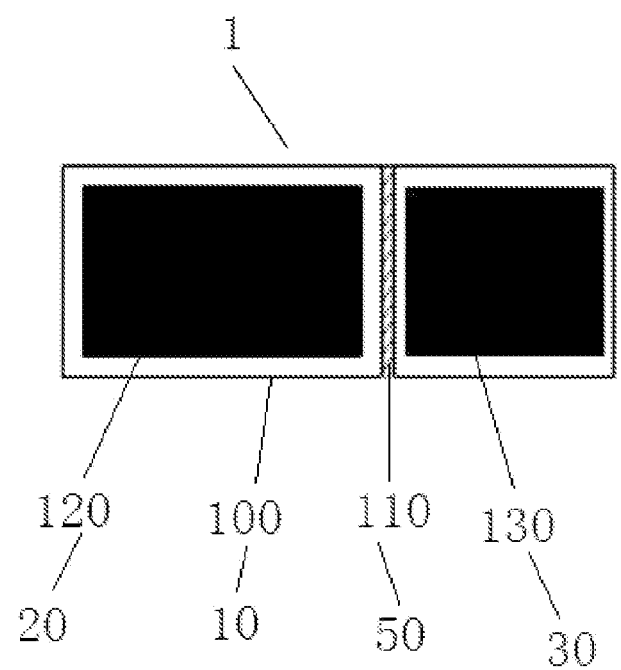
FIG. 18 is a schematic diagram showing an internal structure of a power module of a power conversion system according to an exemplary embodiment.

As shown in FIG. 18, the power module 1 further includes: a high voltage power unit 120 (or a high voltage power unit 20) including a high voltage input terminal; a low voltage power unit 130 (or a low voltage power unit 30) including a low voltage output terminal; a body 10 (or body 100), the high voltage power unit 120 and the low voltage power unit 130 being both arranged in the body; and a third divider 50 (or a third divider 110). The high voltage power unit 120 and the low voltage power unit 130 are arranged at both sides of the third divider 50.

In one embodiment, as shown in FIGS. 19 to 32, each of the power modules 1 further includes: a first air passage 11 and a second air passage 12 in the body 10 which are separated by the third divider 50, wherein the first air passage 11 and the second air passage 12 are continuous air passages (i.e., there is no block along the air flowing path in the first and second air passages) and stacked; a transformer 40 including a high voltage portion 41 and a low voltage portion 42, the high voltage portion 41 including a first magnetic core 411 and a high voltage coil 412 around the first magnetic core 411; and the low voltage portion 42 including a second magnetic core 421 and a low voltage coil 422 around the second magnetic core 421. The high voltage power unit 20 and the high voltage portion 41 are arranged in the first air passage 11, the low voltage power unit 30 and the low voltage portion 42 are arranged in the second air passage 12. The high voltage coil 412 is electrically connected to the high voltage power unit 20, and the low voltage coil 422 is electrically connected to the low voltage power unit 30.

In one embodiment, the power module 1 divides the interior of the body 10 into the first air passage 11 and the second air passage 12. The first air passage 11 and the second air passage 12 are continuous air passages and stacked. The high voltage power unit 20 and the high voltage portion 41 are arranged in the first air passage 11, and the low voltage power unit 30 and the low voltage portion 42 are arranged in the second air passage 12, and the two power units are separated by the third divider 50. The first air passage 11 and the second air passage 12 which are independent from each other can prevent heat from being transmitted from one passage to the other, and can ensure the airflow circulation, thereby speeding up the heat dissipation inside the body 10. The power module 1 is divided into two independent air passages, which avoids the heat dissipated from a functional module from being transmitted to another module, effectively improving the heat dissipation capacity and the overall heat dissipation efficiency of the power module 1, and can accordingly increase the power density of the power module 1.

In one embodiment, the first air passage 11 and the second air passage 12 extend through the body 10, that is, the front and rear portions of the body 10 are both provided with vents to ensure reliable circulation of airflow. The first air passage 11 and the second air passage 12 are stacked, but the arrangement of the first and second air passages is not limited to the stack arrangement.

Figure 22:
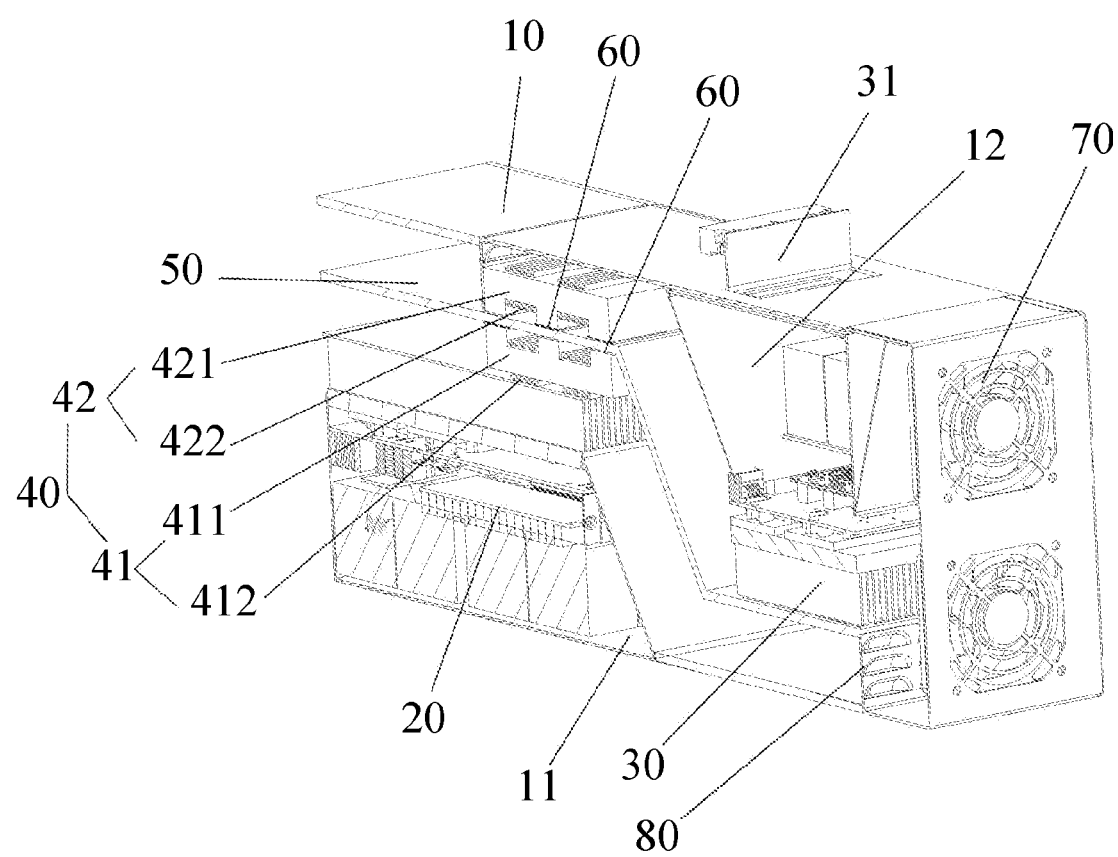
FIG. 22 is a schematic diagram showing an internal structure of a power module according to an exemplary embodiment.

As shown in FIG. 22, the third divider 50 is an insulating member. Each power module 1 further includes: a semi-conductive layer 60. The third divider 50 is provided with a semi-conductive layer 60 on both sides of the third divider 50. The high voltage portion 41 and the low voltage portion 42 are in contact with the semi-conductive layers 60 on both sides of the third divider 50, respectively.

In one embodiment, the third divider 50 and the semi-conductive layers 60 are used to achieve electrical isolation between the high voltage portion 41 and the low voltage portion 42, and the third divider 50 is also used to adjust the clearance between the high voltage portion 41 and the low voltage portion 42. In this way, the function of adjusting the magnitude of the leakage inductance of the transformer 40 is realized. By disposing the semi-conductive layer 60, the electric field on the high voltage portion 41 and the low voltage portion 42 can be evenly distributed on the third divider 50, partial discharge phenomenon can be avoided, and an even distribution of the electric field can be ensured.

In one embodiment, the third divider 50 made from an insulating material can achieve the isolation of the high voltage and the low voltage, so that the transformer 40 does not require solid shielding insulation, and the wrapped insulating layer is not needed. The cooling air can directly be applied to the first magnetic core 411, the high voltage coil 412, the second magnetic core 421 and the low voltage coil 422 to dissipate heat, thereby avoiding the bottleneck for the heat dissipation of the solid insulation. The high voltage power unit 20 does not need to be wrapped by a solid insulating shielding shell, thereby achieving significant reduction in size, weight and structural members cost, and significant increase in power density.

For the specific arrangement of the semi-conductive layers 60, the semi-conductive layers 60 are arranged at least in a region where the two sides of the third divider 50 are in contact with the first magnetic core 411 and the second magnetic core 421, respectively.

In one embodiment, the semi-conductive layer 60 is arranged between the third divider 50 and the first magnetic core 411, that is, the first magnetic core 411 is in contact with the third divider 50 through the semi-conductive layer 60. The first magnetic core 411 has an end portion, and the semi-conductive layer 60 is sandwiched between the end portion of the first magnetic core 411 and the third divider 50, and the projection of this end portion on the third divider 50 is located within the semi-conductive layer 60. That is, the area of the semi-conductive layer 60 may be greater than or equal to the area of the end portion of the first magnetic core 411. The first magnetic core 411 may have a plurality of end portions, and there may be corresponding semi-conductive layers 60. Alternatively, the semi-conductive layers 60 may be formed as a whole. Correspondingly, a semi-conductive layer 60 is arranged between the third divider 50 and the second magnetic core 421, that is, the second magnetic core 421 is in contact with the third divider 50 through the semi-conductive layer 60. The second magnetic core 421 has an end portion. The semi-conductive layer 60 is sandwiched between the end portion of the second magnetic core 421 and the third divider 50, and the projection of this end portion on the third divider 50 is located within the semi-conductive layer 60. That is, the area of the semi-conductive layer 60 may be greater than or equal to the area of the end portion of the second magnetic core 421. The second magnetic core 421 may have a plurality of end portions, and there may be corresponding semi-conductive layers 60. Alternatively, semi-conductive layers 60 may be formed as a whole.

Figure 30:
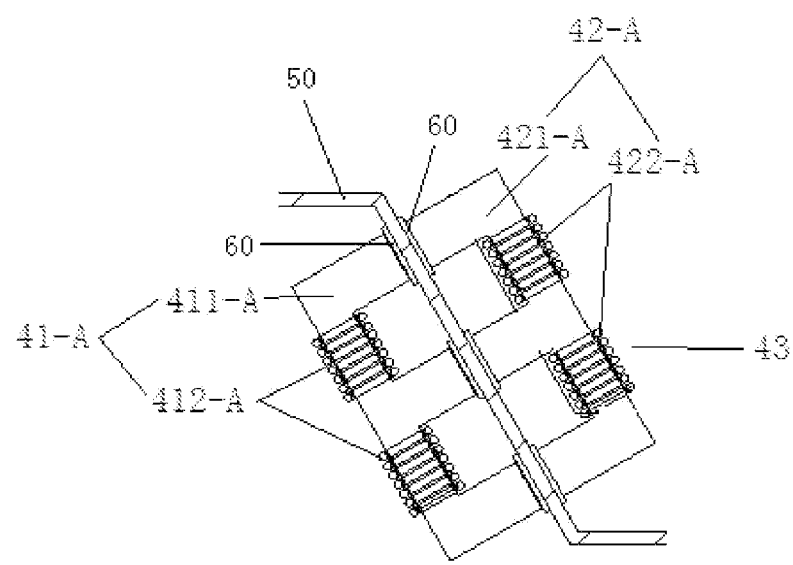
FIG. 30 is a schematic structural diagram showing a main transformer in a power module according to an exemplary embodiment.

In one embodiment, as shown in FIG. 30, the transformer 40 includes a main transformer 43 arranged within the body 10. The main transformer 43 includes a main high voltage portion 41-A and a main low voltage portion 42-A. The main high voltage portion 41-A includes a first main magnetic core 411-A and a main high voltage coil 412-A around the first main magnetic core 411-A. The main low voltage portion 42-A includes a second main magnetic core 421-A and a main low voltage coil 422-A around the second main magnetic core 421-A. The main high voltage coil 412-A is electrically connected to the high voltage power unit 20, in particular, to the main power circuit in the high voltage power unit 20. The main low voltage coil 422-A is electrically connected to the low voltage power unit 30, in particular, to the main power circuit of the low voltage power unit 30.

Figure 29:
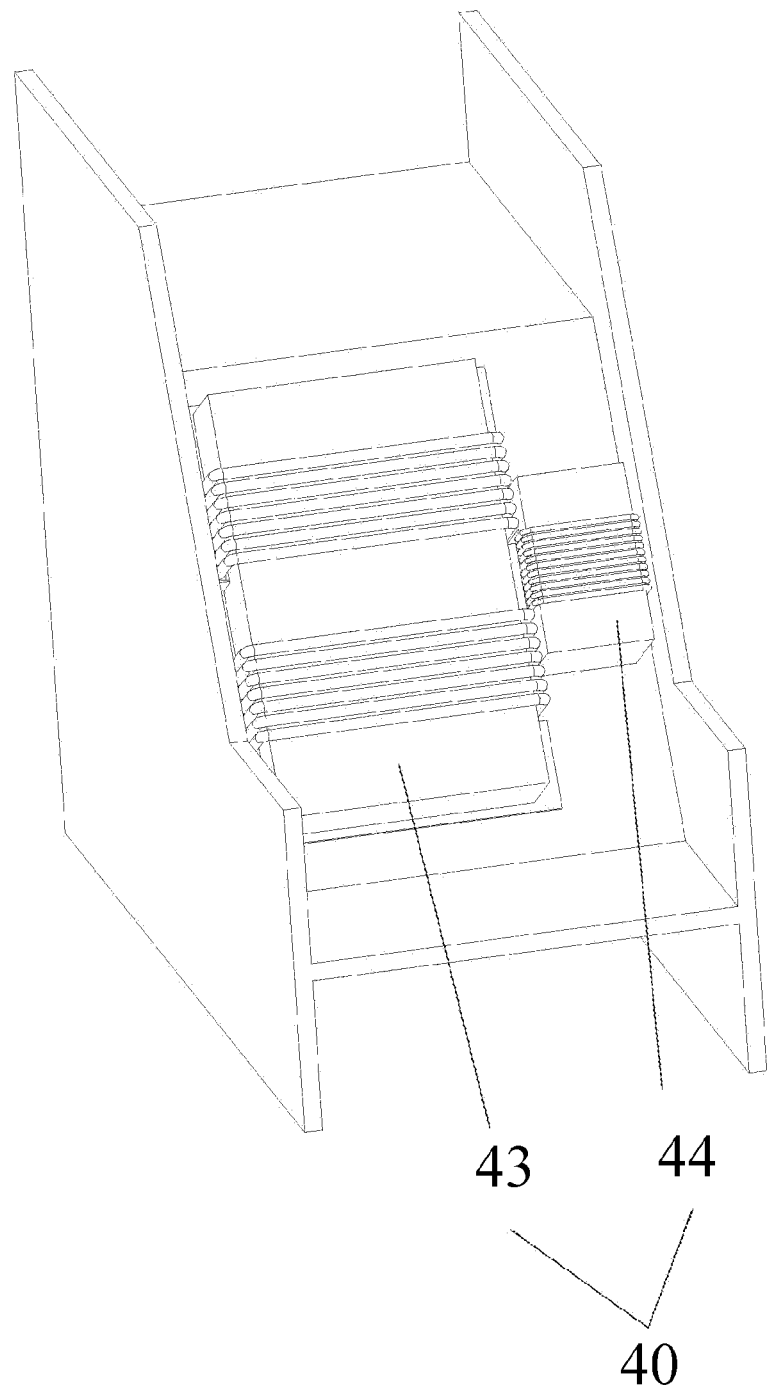
FIG. 29 shows a partial schematic diagram of a power module according to an exemplary embodiment.
Figure 31:
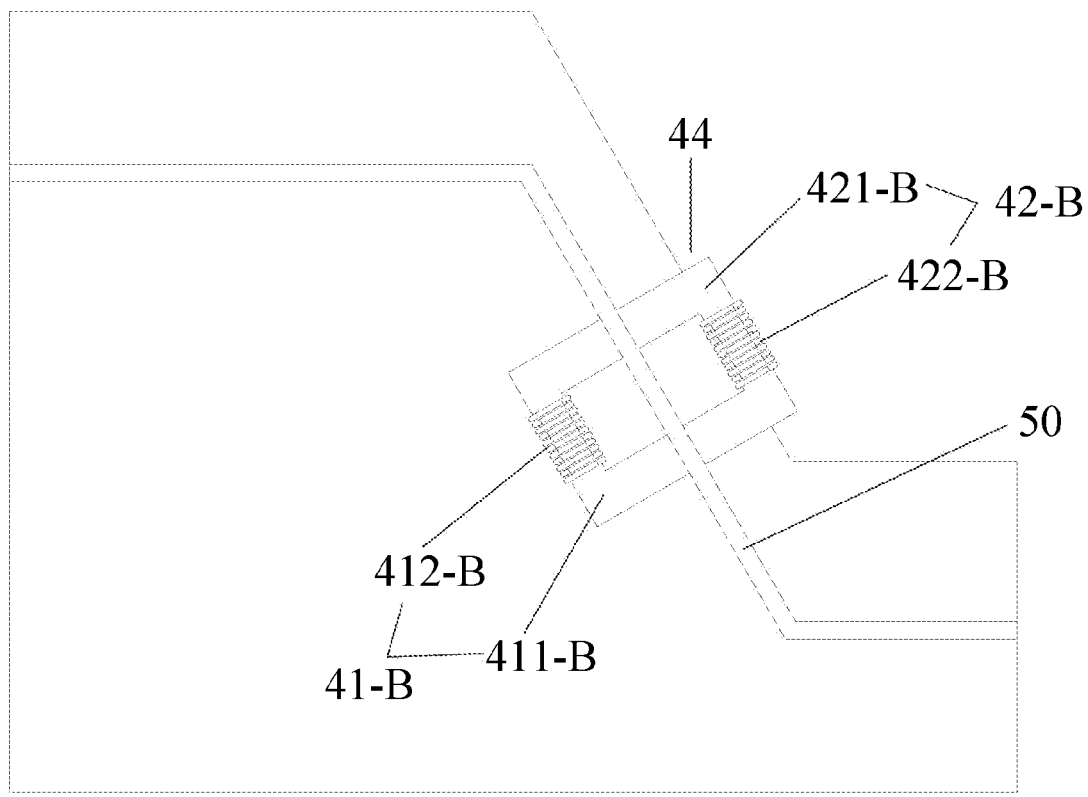
FIG. 31 is a schematic structural diagram showing an auxiliary transformer in a power module shown in FIG. 29.
Figure 32:
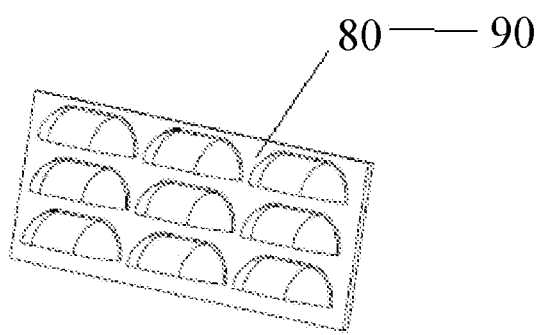
FIG. 32 is a schematic structural diagram showing an isolation plate of a power module according to an exemplary embodiment.

In one embodiment, as shown in FIGS. 29 to 31, the transformer 40 includes a main transformer 43 and an auxiliary transformer 44 arranged in the body 10. The high voltage portion 41 includes a main high voltage portion 41-A and an auxiliary high voltage portion 41-B. The low voltage portion 42 includes a main low voltage portion 42-A and an auxiliary low voltage portion 42-B. The main high voltage portion 41-A and the main low voltage portion 42-A are a high voltage portion and a low voltage portion corresponding to the main transformer 43, respectively. The auxiliary high voltage portion 41-B and the auxiliary low voltage portion 42-B are the high voltage portion and the low voltage portion corresponding to the auxiliary transformer 44, respectively. The auxiliary high voltage portion 41-B includes a first auxiliary magnetic core 411-B and an auxiliary high voltage coil 412-B, and the auxiliary low voltage portion 42-B includes a second auxiliary magnetic core 421-1B and an auxiliary low voltage coil 422-B. The main high voltage coil 412-A and the main low voltage coil 422-A are electrically connected to the main power circuit in the high voltage power unit 20 and the low voltage power unit 30, respectively, so as to realize power transmission of the main power circuit. The auxiliary high voltage coil 412-B and the auxiliary low voltage coil 422-B are electrically connected to the auxiliary power circuit in the high voltage power unit 20 and the low voltage power unit 30, respectively, so as to realize power transmission of the auxiliary power circuit. In this way, power supply can be provided for the control drive and the like of the high voltage power unit 20 and the low voltage power unit 30.

In one embodiment, the transformer 40 includes only the main transformer 43, and the number of main transformers 43 is one or more. In some other embodiments, the transformer 40 includes both the main transformer 43 and the auxiliary transformer 44, and the number of main transformers 43 is one or more, and the number of auxiliary transformers 44 is one or more. Moreover, the main transformers 43 may be arranged in parallel and electrically connected to a plurality of main circuits in the high/low voltage power unit, or may be arranged in parallel and simultaneously electrically connected to one main circuit of the high/low voltage power unit. The auxiliary transformers 44 may be arranged in parallel and electrically connected to a plurality of auxiliary power supply circuits in the high/low voltage power unit, or may be arranged in parallel and simultaneously electrically connected to the same auxiliary power supply circuit in the high/low voltage power unit.

In one embodiment, the main transformer 43 and the auxiliary transformer 44 share the third divider 50, and the main transformer 43 and the auxiliary transformer 44 are arranged side by side such that the auxiliary transformer 44 is integrated into the power module, resulting in a more modular system. On the other hand, the auxiliary transformer 44 and the main transformer 43 share the same insulation, shortening the power cables of the auxiliary transformer 44, reducing the space occupied by the system, and thereby increasing the system power density.

Figure 19:
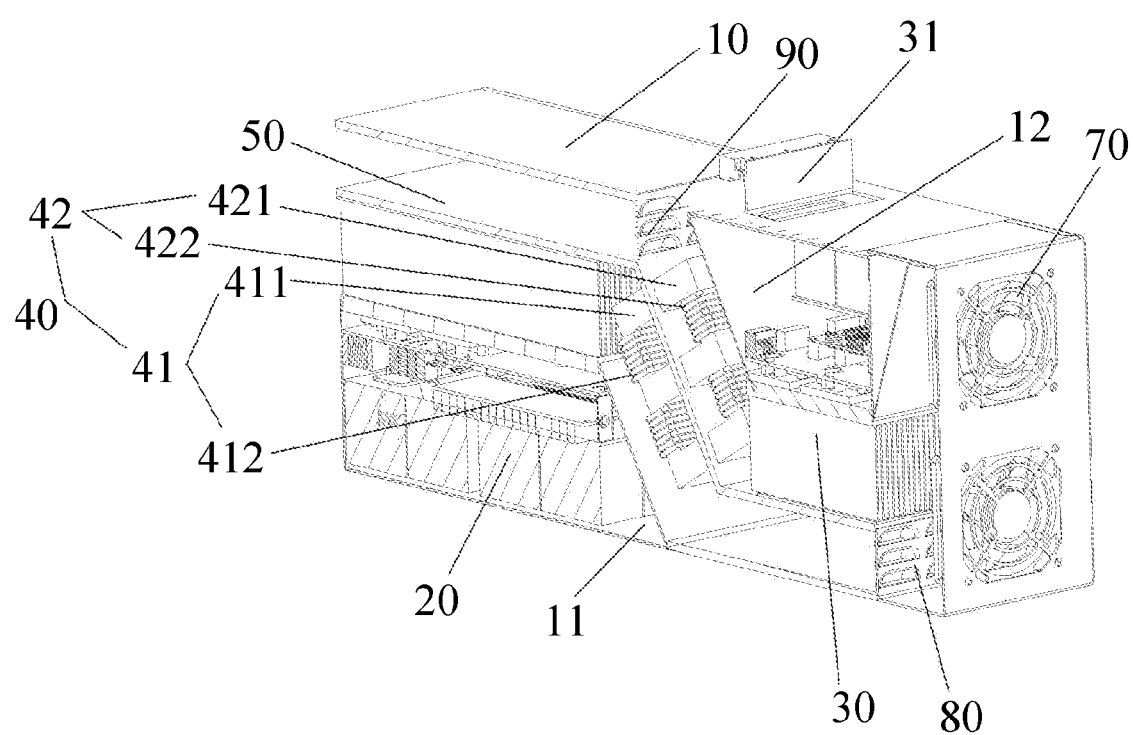
FIG. 19 is a schematic diagram showing an internal structure of a power module according to an exemplary embodiment.

As shown in FIG. 19 and FIG. 22, the power module 1 further includes a first modular blower 70, and the air opening of the first modular blower 70 communicates with both the front portion of the first air passage 11 and the front portion of the second air passage 12.

In one embodiment, the blower is used to blow cold air to the first air passage 11 and the second air passage 12 or suck hot air from the first air passage 11 and the second air passage 12. That is, the air opening of the blower can be used for blowing air or for sucking air depending on the heat dissipation environment and the heat dissipation time. Air circulation inside the first air passage 11 and the second air passage 12 need to be ensured.

In one embodiment, two ends of each air passage along the length direction of the air passage are defined as the front and rear portions, i.e., the front and rear portions of the first air passage 11, and the front and rear portions of the second air passage 12.

Figure 20:
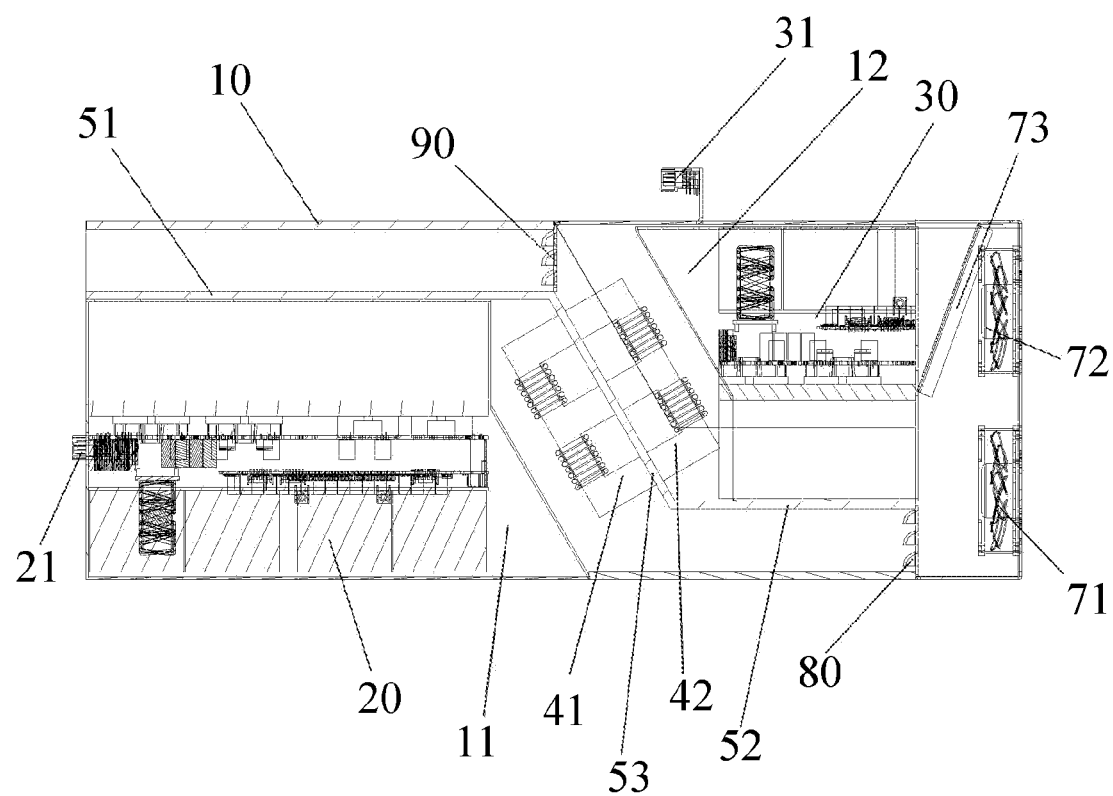
FIG. 20 is a cross-sectional diagram of a power module according to an exemplary embodiment.
Figure 23:
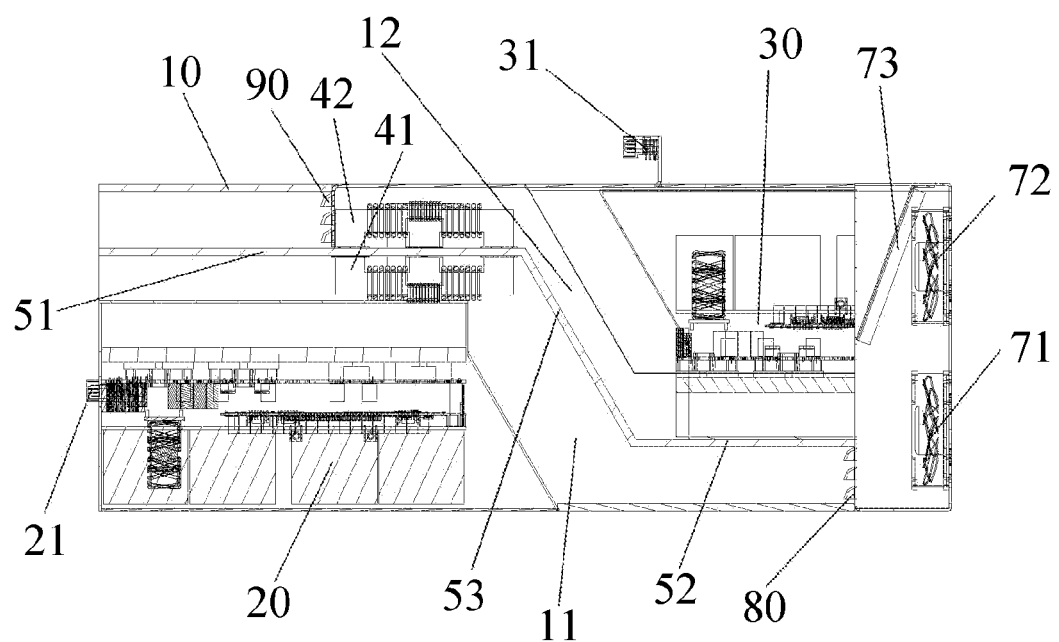
FIG. 23 is a cross-sectional diagram of a power module according to an exemplary embodiment.

As shown in FIG. 20 and FIG. 23, the blower includes a first blower 71, and the air opening of the first blower 71 is located at the front of the first air passage 11 and the second air passage 12. The air-in and air-out directions of the first blower 71 is parallel to the longitudinal direction of the main body 10, that is, parallel to a direction extending from the front to rear portions of the first air passage 11 and the second air passage 12.

In one embodiment, the air opening of the first blower 71 directly blows air to the first air passage 11 and the second air passage 12 or directly sucks air from the first air passage 11 and the second air passage 12. The front-to-rear direction of the first air passage 11 and the second air passage 12 is the direction in which the air flows in or out.

In one embodiment, the blower further includes a second blower 72 located at a front portion of the first air passage 11 and the second air passage 12 and arranged side by side with the first blower 71. The first blower 71 and the second blower 72 ensure that sufficient cold air can be supplied into the first air passage 11 and the second air passage 12, or a sufficient amount of hot air can be sucked out, that is, air circulation inside the air passages can be ensured.

Figure 26:
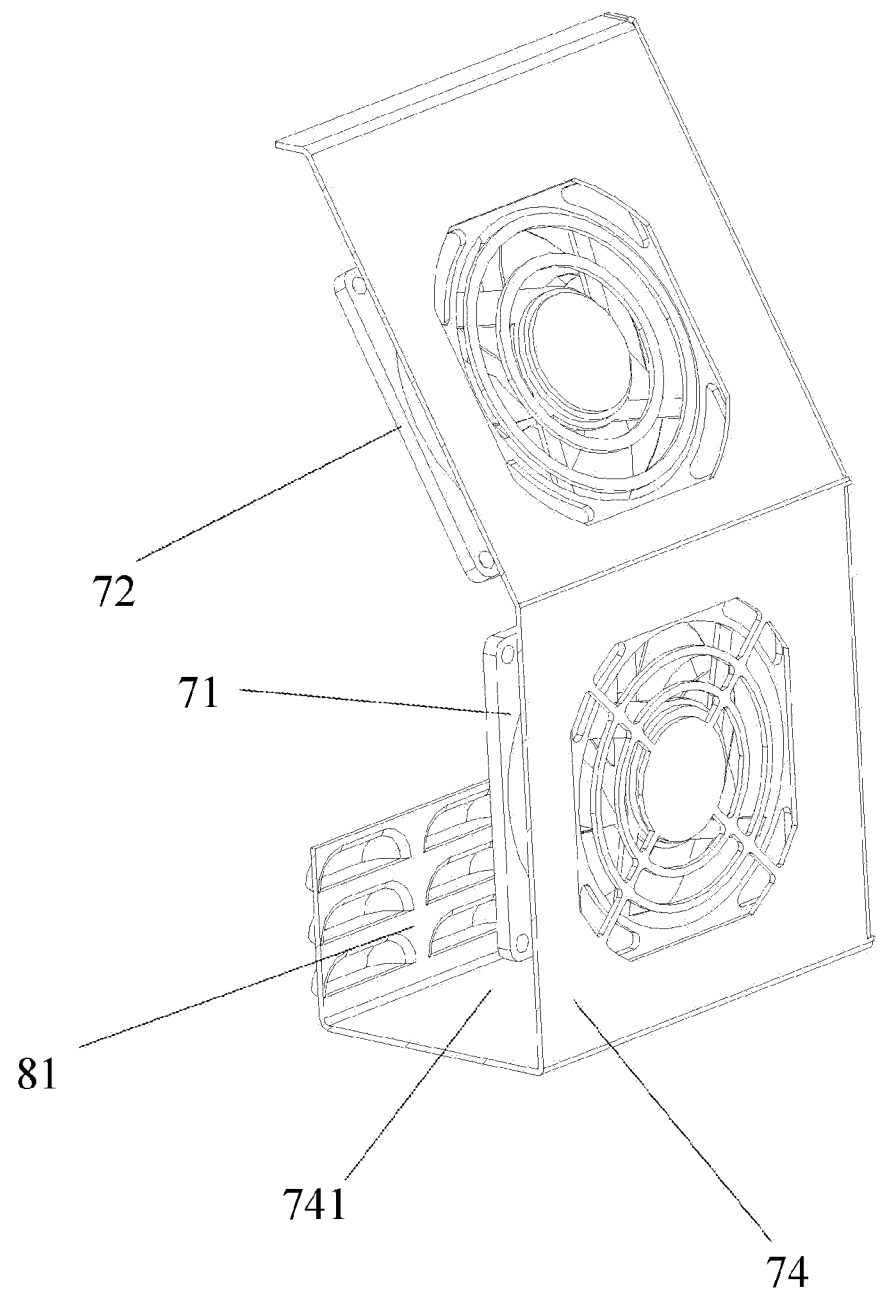
FIG. 26 is a schematic structural diagram showing an internal structure of a blower assembly according to an exemplary embodiment.
Figure 27:
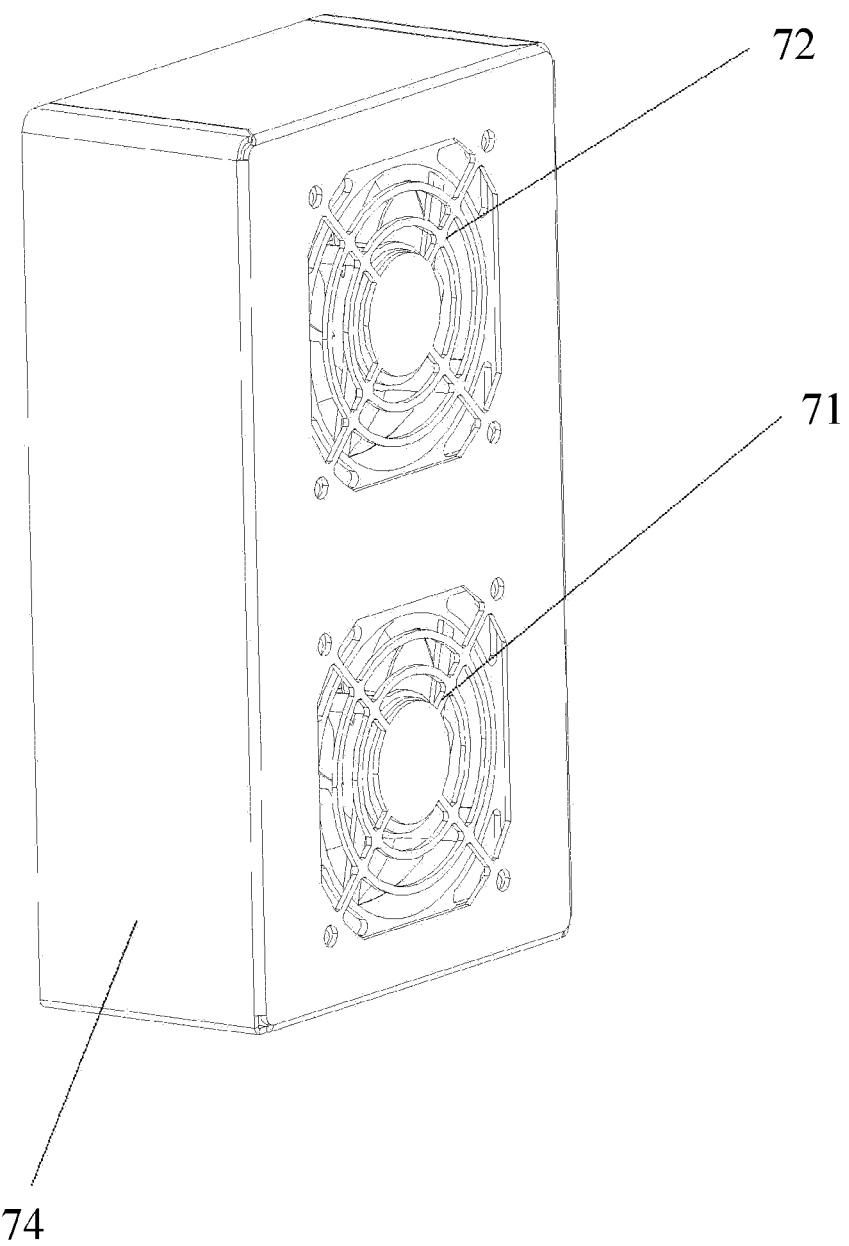
FIG. 27 is a schematic structural diagram showing a blower assembly according to an exemplary embodiment.

With respect to the arrangement of the second blower 72, as shown in FIG. 26, the air opening of the second blower 72 is inclined with respect to the air opening of the first blower 71, and is inclined toward the front portions of the first air passage 11 and the second air passage 12. The air opening of the second blower 72 is inclined in order to ensure that the inflow and outflow of the second blower 72 can flow through the first air passage 11 and the second air passage 12 more easily.

Figure 28:
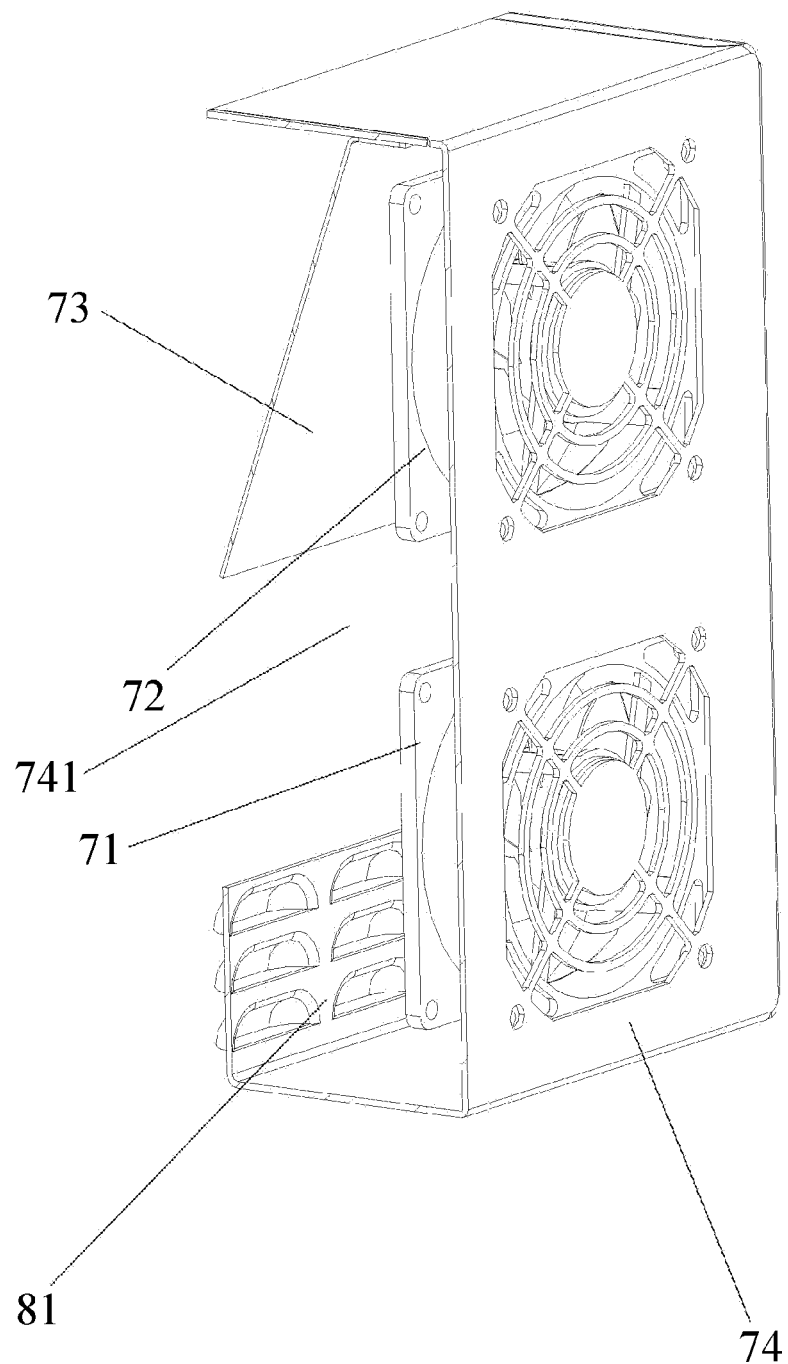
FIG. 28 is a schematic structural diagram showing an internal structure of a blower assembly according to an exemplary embodiment.

As shown in FIG. 28, the air opening of the second blower 72 is arranged in parallel with the air opening of the first blower 71. The first modular blower 70 further includes an air deflector 73. The air deflector 73 is inclined with respect to the air opening of the second blower 72, so that the cold air blown from the air opening of the second blower 72 passes along the air deflector 73 and blows to the first air passage 11 and the second air passage 12 or the hot air generated by the first air passage 11 and the second air passage 12 passes along the air deflector 73 and is sucked out by the air opening of the second blower 72.

In one embodiment, the second blower 72 is arranged in the same manner as the first blower 71. The air opening of the second blower 72 is directed toward one air passage. In order to make it easier for the air entering into or sucked out from the air opening of the second blower 72 to flow through the first air passage 11 and the second air passage 12 at the same time, an inclined air deflector 73 is provided to guide the air. The angle of the air deflector 73 is adjustable.

In one embodiment, the front portion of the first air passage 11 is smaller than the front portion of the second air passage 12, and the air opening of the first air blower 71 simultaneously faces the front portion of the first air passage 11 and the front portion of the second air passage 12, and the second blower 72 and the first blower 71 are stacked. In order to make the air entering into or sucked out from the air opening of the second blower 72 to flow through the first air passage 11 and the second air passage 12 at the same time, the second blower 72 may be inclined, or an air deflector 73 may be provided to guide the air.

In one embodiment, the first modular blower 70 is arranged on a side of the body 10 proximate to the low voltage power unit 30. Considerations about the arrangement for the position of the first modular blower 70 include safety concerns, and reduction of the length of the power module 1. That is, the electrical clearance and creepage distance that need to be reserved will be smaller in a case where the first modular blower 70 is arranged on a side proximate to the low voltage power unit 30, compared to the case where the first modular blower 70 is arranged on a side proximate to the high voltage power unit 20, thereby reducing the size of the power module 1 in the longitudinal direction.

In one embodiment, there may be more or less first modular blowers 70 depending on different power levels.

As shown in FIG. 19 and FIG. 20, the first modular blower 70 is arranged in the body 10. The power module 1 further includes: a fourth divider 80 arranged at the side of the first air passage 11 near the first modular blower 70. The high voltage power unit 20 and the high voltage portion 41 are both located at the same side of the fourth divider 80, and located at the side in opposite to the side where the first modular blower 70 is located. The fourth divider 80 is provided with a first air guiding opening which communicates with the front portion of the first air passage 11.

In one embodiment, although the first air passage 11 and the second air passage 12 are two independent air passages, since they are in communication with the outside, that is, air circulation is required, there exists the problem in actual usage that the high voltage power unit 20 and the high voltage portion 41 may be electrically connected to the low voltage power unit 30 and the low voltage portion 42 and the inside of the first modular blower by electric arc due to discharge, thereby affecting the normal operation of the low voltage power unit 30 and the low voltage portion 42 and the first modular blower 70. The fourth divider 80 can prevent this problem from occurring. That is, the high voltage region (including the high voltage power unit 20 and the high voltage portion 41) and the low voltage region (including the low voltage power unit 30 and the low voltage portion 42) are further divided by the fourth divider 80.

In one embodiment, the fourth divider 80 is provided with a plurality of first air guiding openings.

FIG. 24 to FIG. 28 show the specific structure of the first modular blower 70. The first modular blower 70 further includes a mounting portion 74. The blower is arranged in the mounting portion 74, and the mounting portion 74 is connected to the body 10. The mounting portion 74 is provided with a vent 741 for communicating with the first air passage 11 and the second air passage 12.

In one embodiment, the first modular blower 70 and the body 10 are independent. That is, the first modular blower 70 is connected to the body 10 through the mounting portion 74, and can be detached at any time during usage. Both the first blower 71 and the second blower 72 are arranged on the mounting portion 74.

In one embodiment, when the air opening of the first blower 71 is arranged in parallel with the air opening of the second blower 72, the air deflector 73 of the first modular blower 70 is also arranged on the mounting portion 74.

In one embodiment, the first blower 71 and the second blower 72 are both fans.

In one embodiment, at least a portion of the vent 741 is open, and the power module 1 further includes a fifth divider 81 arranged on the mounting portion 74 for shielding the portion which is the open. The fifth divider 81 is provided with a second air guiding opening which is in communication with the front portion of the first air passage 11. The fifth divider 81 can isolate the first air passage 11 from the vent 741 to prevent that the internal discharge of the high voltage region results in that the high voltage region may be electrically connected to the low voltage region and the inside of the first modular blower by electric arc due to discharge, which may reduce the safety performance of the power module 1.

In one embodiment, the fifth divider 81 is provided with a plurality of second air guiding openings.

The first air passage 11 and the second air passage 12 may be arranged as follows. For example, the first air passage 11 is located below the second air passage 12, or the first air passage 11 is located above the second air passage 12. The terms "below" and "above" herein may also indicate the arrangement relationship of partial structures, and it is not excluded that portions of the first air passage 11 and the second air passage 12 are located in the same horizontal plane.

For example, the third divider 50 can be a bent plate, and the high voltage power unit 20 and the low voltage power unit 30 are sequentially arranged along the longitudinal direction of the body 10. The third divider 50 formed as the bent plate can reduce the volume of the power module 1 as a whole.

As shown in FIG. 20 and FIG. 23, the third divider 50 includes a first plate 51 arranged on the body 10, and extending along the length direction of the body 10; a second plate 52 arranged on the body 10 and extending along the length direction of the body 10. The first plate 51 and the second plate 52 are sequentially arranged along the height direction of the body 10. The third divider 50 further include a third plate 53 arranged on the body 10 and configured to connect the first plate 51 and the second plate 52. The third plate 53 is inclined with respect to the first plate 51 and the second plate 52. The high voltage power unit 20 and the low voltage power unit 30 are located at both sides of the third plate 53, respectively.

In one embodiment, the third divider 50 is composed of the first plate 51, the second plate 52, and the third plate 53. The first plate 51 and the second plate 52 are horizontally arranged but not in the same horizontal plane, and the third plate 53 configured to connect the first plate 51 and the second plate 52 is arranged obliquely or perpendicular to the horizontal plane, that is, the third divider 50 divides the body 10 into upper and lower portions. The first air passage 11 may be located below the second air passage 12 or may be located above the second air passage 12.

The high voltage portion 41 and the low voltage portion 42 may be arranged as follows. For example, the high voltage portion 41 and the low voltage portion 42 are respectively located on both sides of the first plate 51; or the high voltage portion 41 and the low voltage portion 42 are located on both sides of the second plate 52, respectively; or the high voltage portion 41 and the low voltage portion 42 are located on both sides of the third plate 53, respectively.

In one embodiment, as shown in FIGS. 22 and 23, the high voltage portion 41 and the low voltage portion 42 are located on both sides of the first plate 51, respectively. That is, the high voltage portion 41 and the low voltage portion 42 are arranged in the horizontal direction. The high voltage power unit 20 is stacked with the high voltage portion 41 and the low voltage portion 42 of the transformer 40. The heat of the high voltage power unit 20 and the high voltage portion 41 is dissipated in the first air passage 11; the heat of the low voltage power unit 30 and the low voltage portion 42 is dissipated in the second air passage 12.

In one embodiment, the high voltage portion 41 and the low voltage portion 42 are located on both sides of the second plate 52, respectively. That is, the low voltage power unit 30 may also be stacked with the low voltage portion 42 and the high voltage portion 41 of the transformer 40.

In one embodiment, when the high voltage portion 41 and the low voltage portion 42 are arranged horizontally, it is easier to fix them.

In one embodiment, as shown in FIGS. 19 and 20, the high voltage portion 41 and the low voltage portion 42 are located on both sides of the third plate 53, respectively. That is, the high voltage portion 41 and the low voltage portion 42 are inclined with respect to the horizontal plane. In this embodiment, the high voltage portion 41 and the low voltage portion 42 can effectively utilize the internal space of the air passage and meet the requirements of the creepage distance, thereby reducing the overall volume of the body 10.

As shown in FIG. 20 and FIG. 23, the power module 1 further includes: a sixth divider 90 arranged in the second air passage 12 and configured to divide the second air passage 12 into two parts. The low voltage power unit 30 and the low voltage portion 42 are both located at the same side of the sixth divider 90. The sixth divider 90 is provided with a third air guiding opening.

In one embodiment, the sixth divider 90 is arranged to avoid the situation that the high voltage region may be electrically connected to the low voltage region by electric arc due to discharge, which may affect the normal operation inside the low voltage region. By the sixth divider 90, the high and low voltage regions are further divided. The function of the sixth divider 90 is similar to that of the fourth divider 80 or fifth divider 81.

In one embodiment, the sixth divider 90 is provided with a plurality of third air guiding openings.

In one embodiment, the sixth divider 90 is located at a position of the second air passage 12 near the low voltage power unit 30. The sixth divider 90, along with a metal housing (body 10) surrounding the low voltage power unit 30, a fan fixing housing (the mounting portion 74) and the fourth divider 80 (or the fifth divider 81), divide the inside of the body 10 into a low voltage region and a high voltage region. The fourth divider 80 (or the fifth divider 81) and the sixth divider 90 are made of a metal material, and the isolation plate has a structure with holes (such as louver hole) to ensure that the high voltage unit cannot be directly viewed from the low voltage unit. The high and low voltages of the power modules 1 are separated. The isolation plate is added to increase the safety of the power modules 1 to prevent the situation that the high voltage region may be electrically connected to the low voltage region by electric arc due to discharge. The louver holes in the isolation plate ensure the heat dissipation and safety of the power module 1.

In one embodiment, the first plate 51 is located above the second plate 52; the upper and lower sides of the first plate 51, the third plate 53, and the second plate 52 are the second air passage 12 and the first air passage 11, respectively. The high voltage power unit 20 is located below the first plate 51, and the low voltage power unit 30 is located above the second plate 52; or, the upper and lower sides of the first plate 51, the third plate 53, and the second plate 52 are the first air passage 11 and the second air passage 12, respectively. The low voltage power unit 30 is located below the first plate 51, and the high voltage power unit 20 is located above the second plate 52. The first modular blower 70 is arranged at a side of the body 10 adjacent to the low voltage power unit 30.

Figure 21:
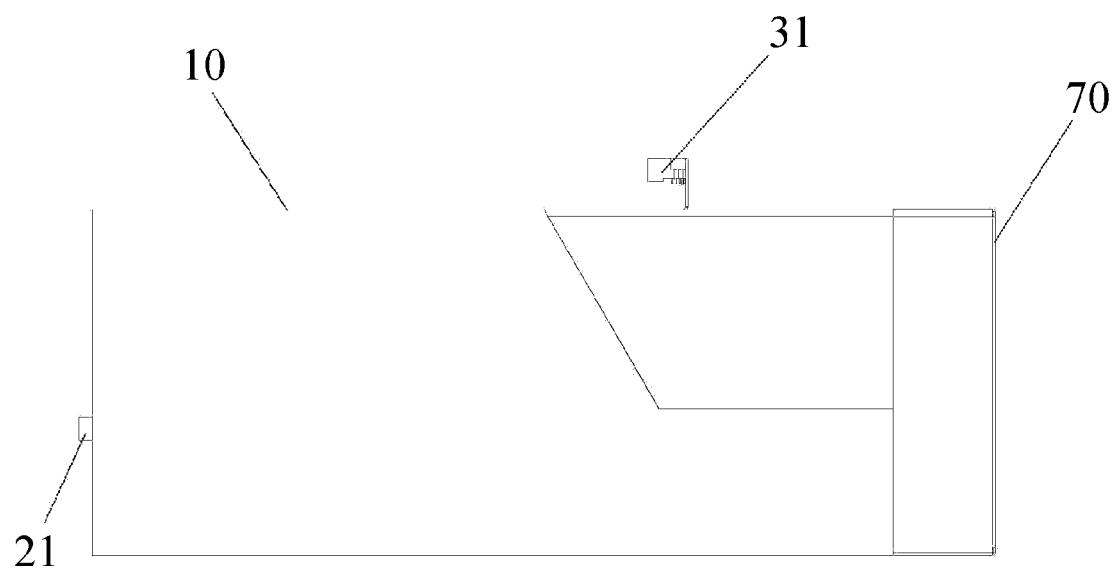
FIG. 21 is a schematic structural diagram of a power module according to an exemplary embodiment.
Figure 24:
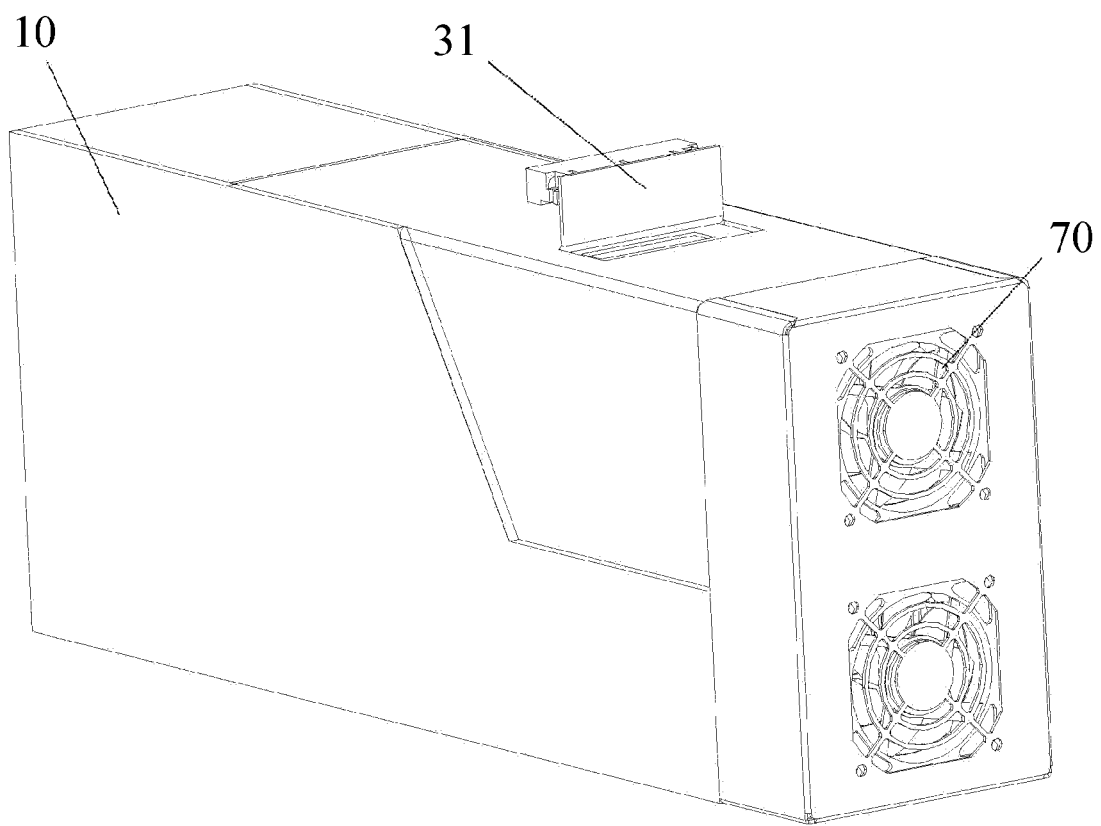
FIG. 24 is a schematic structural diagram of a power module according to an exemplary embodiment.
Figure 25:
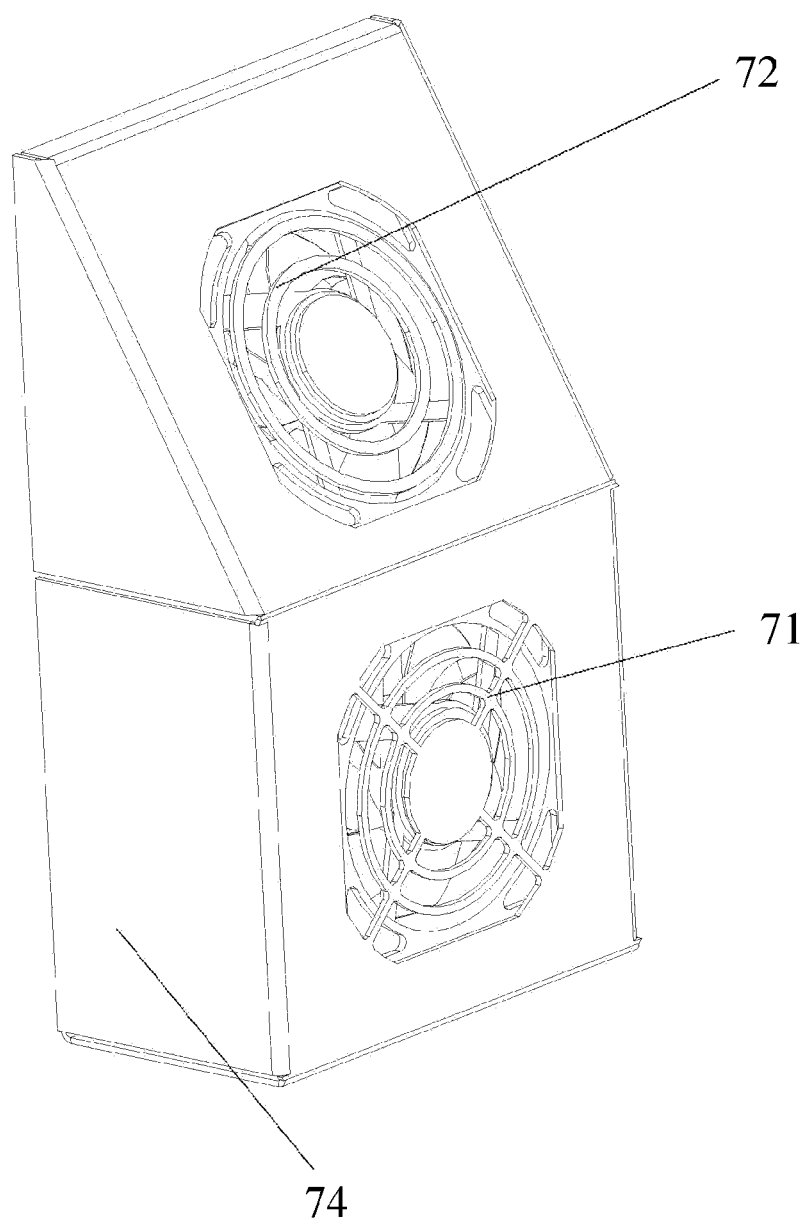
FIG. 25 is a schematic structural diagram showing a blower assembly according to an exemplary embodiment.

As shown in FIG. 21 and FIG. 24, the power module 1 further includes: a high voltage input terminal 21 arranged on the high voltage power unit 20 and protruding from the left and right sides or the rear portion of the body 10; a low voltage output terminal 31 arranged on the low voltage power unit 30 and protruding from the top or bottom surface of the body 10. In one embodiment, when the second air passage 12 is located above the first air passage 11, the low voltage output terminal 31 can be arranged on the top surface; when the second air passage 12 is located below the first air passage 11, the low voltage output terminal 31 can be arranged on the bottom surface. However, it is also possible to make appropriate adjustments during actual usage, as long as the interconnection of the plurality of the low voltage output terminals 31 of the power module 1 and the insertion and removal of the power module 1 are convenient.

In one embodiment, the high voltage input terminal 21 is located on both sides or rear portion of the high voltage power unit 20 to facilitate the interconnection of the plurality of the high voltage input terminals 21 of the power module 1 and the insertion and removal of the power module 1.

In one embodiment, as shown in FIGS. 33 to 40, the body 100 includes a first housing 101 and a second housing 102. The first housing 101 and the second housing 102 are connected to each other in the length direction of the body 100. The first housing 101 is an insulating housing, the second housing 102 is a metal housing, and the high voltage power unit 120 and the low voltage power unit 130 are arranged in the first housing 101 and the second housing 102, respectively, and located at both sides of the third divider 110.

In one embodiment, the body 100 is divided into a first housing 101 and a second housing 102. The high voltage power unit 120 is arranged within the first housing 101, and the low voltage power unit 130 is arranged within the second housing 102. That is, the high voltage power unit 120 and the low voltage power unit 130 are arranged in the insulating housing and the metal housing, respectively, and the high voltage power unit 120 and the low voltage power unit 130 are separated by the third divider 110. Since the first housing 101 and the second housing 102 are connected to each other in the length direction of the body 100, that is, the high voltage power unit 120 and the low voltage power unit 130 are sequentially arranged along the length direction of the body 100, the size of the power module 1 in the height direction can be reduced.

In one embodiment, the first housing 101 is an insulating housing, and the insulating housing is an unshielded solid insulating housing. There is no ground potential around the end of the high voltage power unit 120, and therefore there is no creepage and electrical clearance requirements. The size of the insulating housing in the depth direction which is required for protecting the high voltage power unit 120 can be reduced, and at the same time, the wall thickness is thinned to reduce weight.

In one embodiment, the third divider 110 is located between the first housing 101 and the second housing 102, and the high voltage power unit 120 and the low voltage power unit 130 are arranged in the first housing 101 and the second housing 102, respectively. The high voltage power unit 120 and the low voltage power unit 130 are isolated by the third divider 110 and do not overlap in the vertical direction.

In one embodiment, the power module 1 further includes a transformer 140 electrically connected to both the high voltage power unit 120 and the low voltage power unit 130; the transformer 140 and the high voltage power unit 120 are stacked, or the transformer 140 and the low voltage power unit 130 are stacked.

In one embodiment, the transformer 140 and the high voltage power unit 120 are stacked, or the transformer 140 and the low voltage power unit 130 are stacked. Considering that the transformer 140 is electrically connected to both the high voltage power unit 120 and the low voltage power unit 130, stacking the transformer 140 and at least one of the high voltage power unit 120 and the low voltage power unit 130 can improve the internal space utilization of the body 100.

In one embodiment, the transformer 140 employs a shielded solid insulation.

In one embodiment, the third divider 110 is a metal member and is connected to the second housing 102. The third divider 110 and the second housing 102 both made of metal material form a low voltage accommodating cavity for accommodating the low voltage power unit 130. A high voltage accommodating cavity for accommodating the high voltage power unit 120 is formed between the third divider 110 and the first housing 101.

Figure 38:
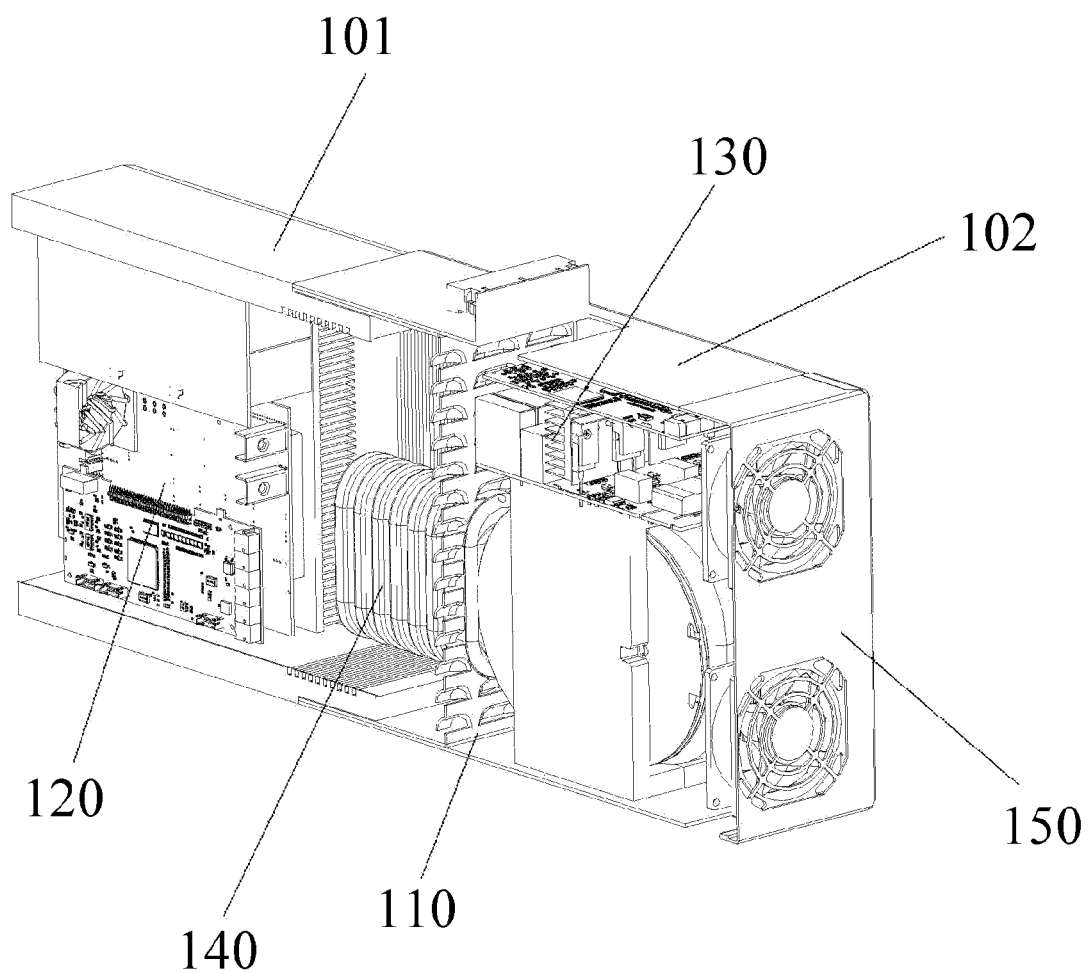
FIG. 38 shows a partial structural diagram of a power module according to an exemplary embodiment.
Figure 39:
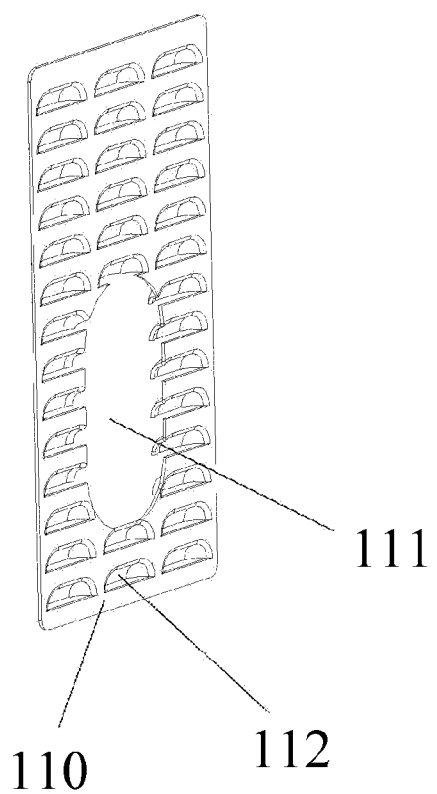
FIG. 39 is a schematic structural diagram of a third divider of a power module according to an exemplary embodiment.
Figure 40:
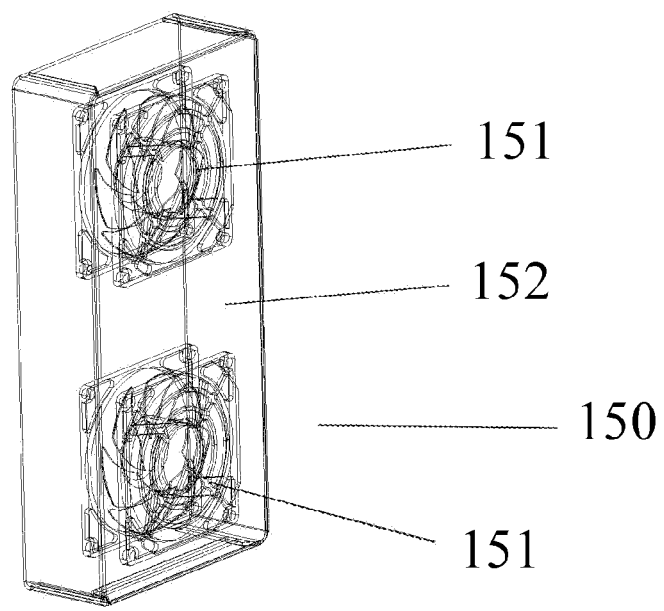
FIG. 40 is a schematic structural diagram of a blower assembly of a power module according to an exemplary embodiment.

As shown in FIGS. 38 and 39, the third divider 110 is provided with an opening 111 through which the transformer 140 passes. The transformer 140 is inserted in the opening 111, that is, the two ends of the transformer 140 are located in the first housing 101 and the second housing 102, respectively, and the high voltage end of the transformer 140 is located in the first housing 101, and the low voltage end is located in the second housing 102.

As shown in FIG. 39, the third divider 110 is provided with a plurality of heat dissipation vents 112. The arrangement of the heat dissipation vents 112 can ensure that the air passages are formed inside the first housing 101 and the second housing 102, thereby realizing the circulation of the internal air, which is favorable for timely heat dissipation.

In one embodiment, the third divider 110 can increase the safety of the power unit, preventing the situation that the high voltage power unit 120 may be electrically connected to the lower voltage power unit 130 by electric arc due to discharge. The third divider 110 can be arranged as a louver. The heat dissipation vents 112 ensure that the first housing 101 and the second housing 102 cannot be directly viewed from each other, and is advantageous for ensuring heat dissipation and safety requirements of the power unit.

Figure 35:
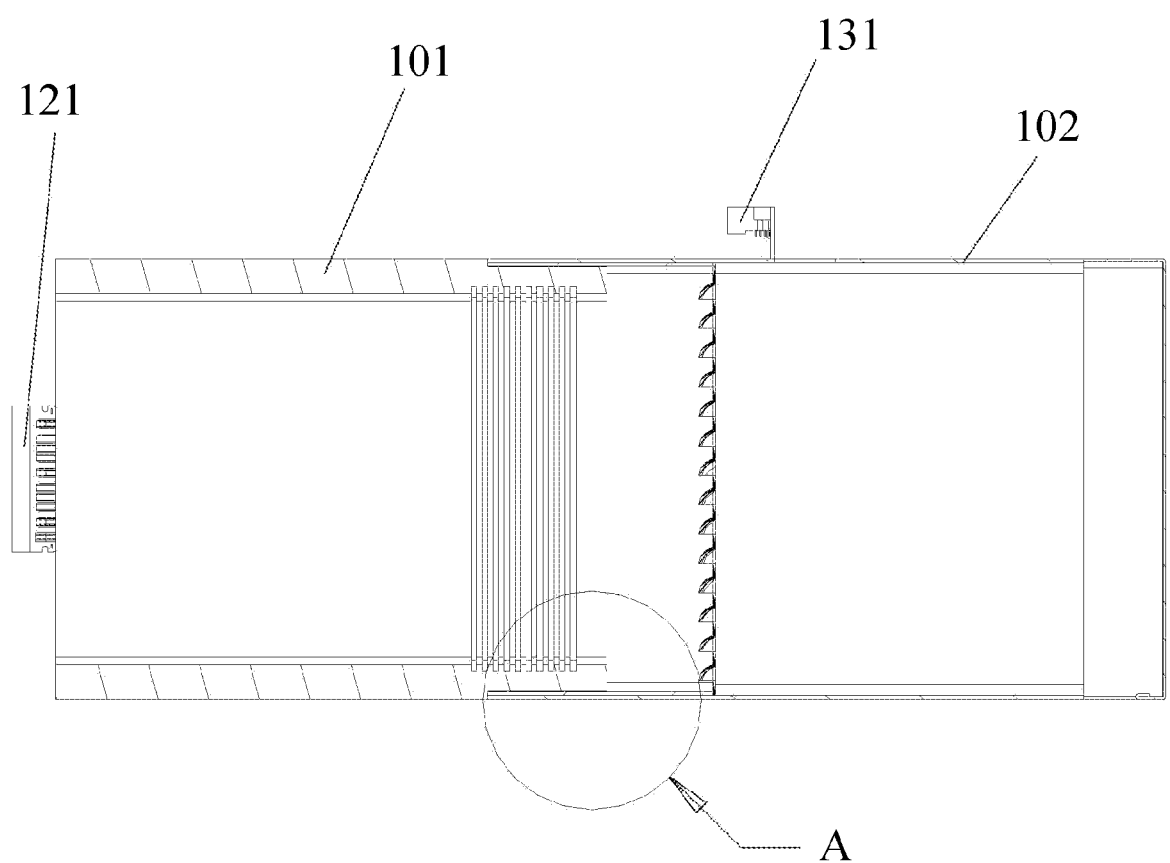
FIG. 35 is a cross-sectional view of a body of a power module according to an exemplary embodiment.
Figure 36:
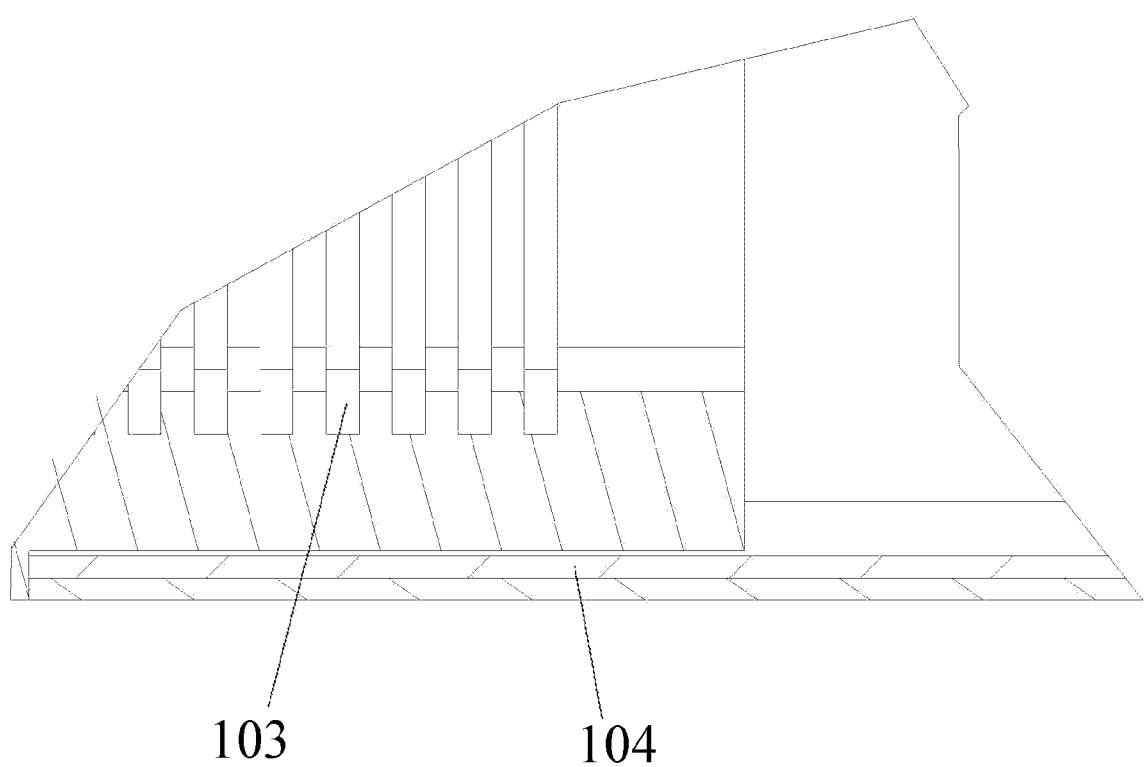
FIG. 36 is an enlarged schematic diagram of the part A in FIG. 35.

As shown in FIGS. 35 and 36, a side of the first housing 101 adjacent to the second housing 102 is provided with a creepage structure 103 for increasing the creepage distance. Since the first housing 101 is an insulating housing, the creepage structure 103 inside the insulating housing that increases the creepage distance can reduce space as required by the creepage distance and the electrical clearances, thereby reducing the length of the housing, reducing the weight of the housing and saving the cost of the housing. The creepage structure 103 is a groove or a protrusion extending in a circumferential direction of one end of the first housing 101.

As shown in FIGS. 35 and 36, an insulating layer 104 is arranged on the side of the second housing 102 adjacent to the first housing 101. Since the second housing 102 is a metal housing, the insulation layer 104 inside the metal housing reduces the space required by the creepage distance and the electrical clearances, thereby reducing the length of the housing, reducing the weight of the housing and saving the cost of the housing. The insulating layer 104 is a coating layer or insulating paper, which extends in a circumferential direction of one end of the second housing 102. According to an exemplary embodiment, the insulating paper is a barrel-shaped insulating paper.

In one embodiment, the first housing 101 and the second housing 102 are connected to each other, and a portion of the first housing 101 is located within the second housing 102. The creeping structure 103 for increasing the creepage distance is arranged on a side of the first housing 101 adjacent to the second housing 102, and the insulating layer 104 is arranged on a side of the second housing 102 adjacent to the first housing 101.

Figure 34:
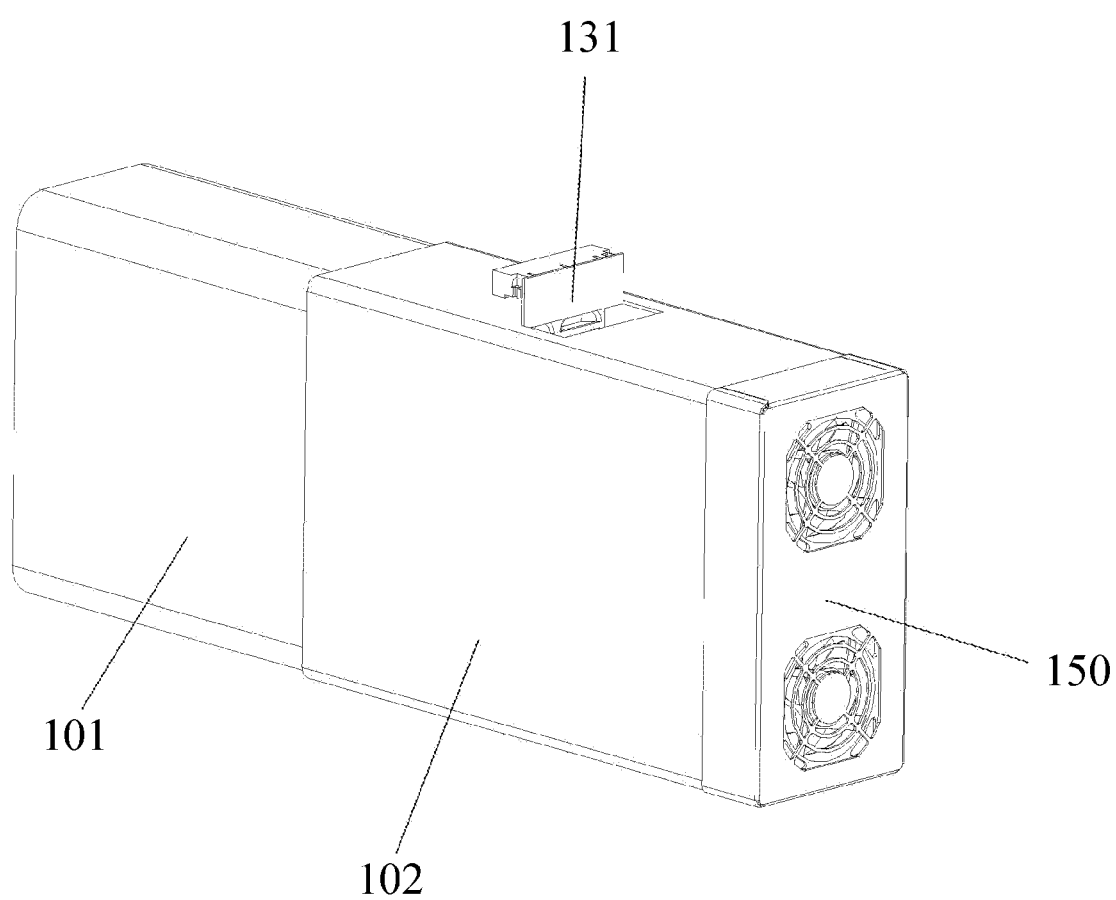
FIG. 34 is a schematic structural diagram of a power module from a first view according to an exemplary embodiment.

In one embodiment, as shown in FIG. 34, the power module 1 further includes: a second modular blower 150 arranged on a side of the second housing 102 away from the first housing 101; the air opening of the second modular blower 150 is in communication with the inside of the second housing 102. The second modular blower 150 is arranged to ensure timely heat dissipation in the interior of the first housing 101 and the second housing 102.

In one embodiment, the second modular blower 150 is arranged at a side of the second housing 102 away from the first housing 101. Considerations about the arrangement for the position of the second modular blower 150 include safety concerns, and reduction of the size of the power module 1 in the length direction. That is, the electrical clearance and creepage distance that need to be reserved will be smaller in a case where the second modular blower 150 is arranged on a side proximate to the low voltage power unit 30, compared to the case where the second modular blower 150 is arranged on a side proximate to the high voltage power unit 20, thereby reducing the size of the power module 1 in the longitudinal direction.

In one embodiment, the second modular blower 150 is arranged outside the second housing 102 and away from the first housing 101; the air opening of the blower 151 is in communication with the interior of the second housing 102. The second modular blower 150 includes a blower 151 and a mounting housing 152. The mounting housing 152 and the second housing 102 are spliced together, that is, the second modular blower 150 and the second housing 102 are two independently arranged structures.

In one embodiment, the blower 151 is a fan.

In one embodiment, there may be more or less second modular blower 150 depending on different power levels.

Figure 33:
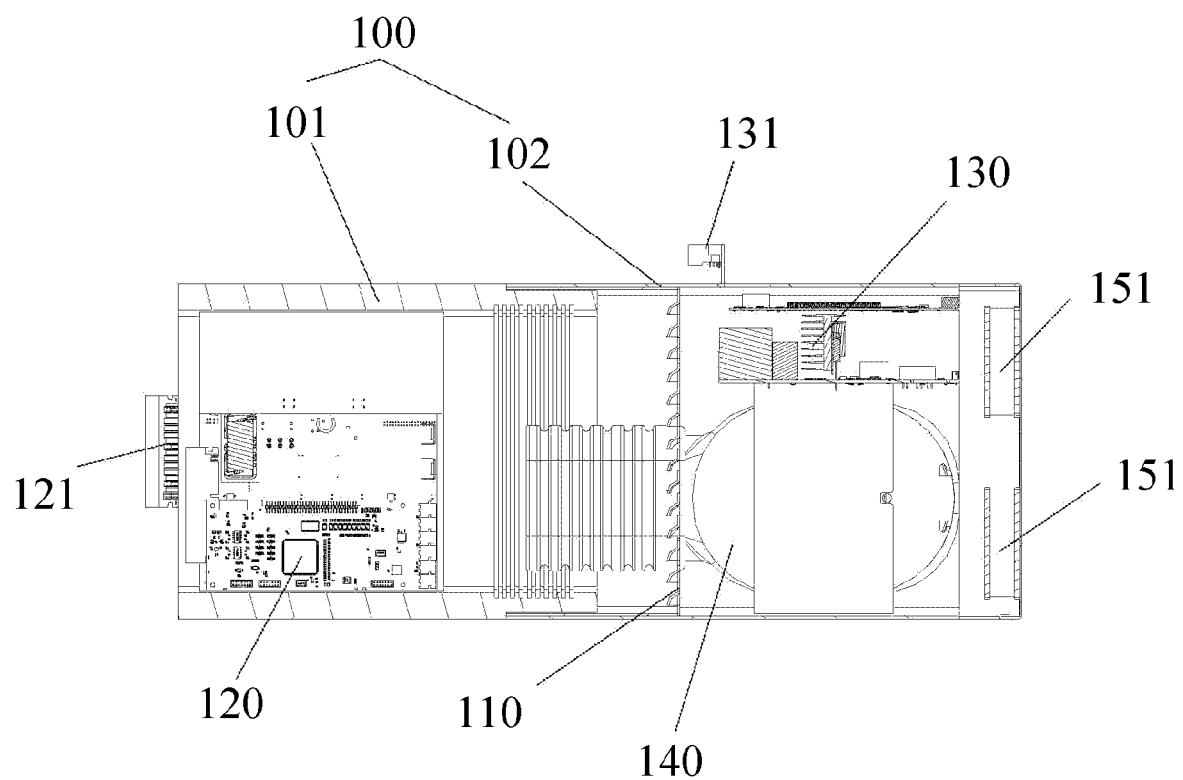
FIG. 33 is a cross-sectional diagram of a power module according to an exemplary embodiment.
Figure 37:
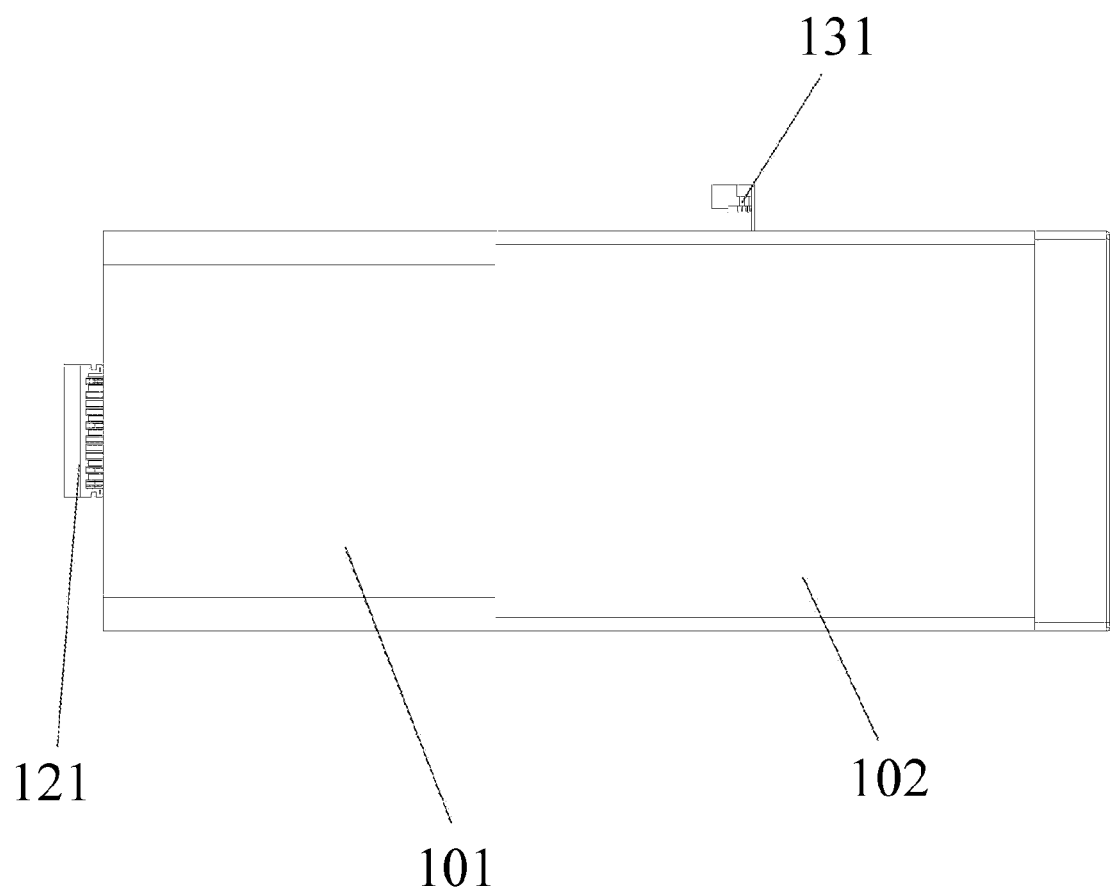
FIG. 37 is a schematic structural diagram of a power module from a second view according to an exemplary embodiment.

As shown in FIG. 33 and FIG. 37, the power module 1 further includes: a high voltage input terminal 121 protruding from the left and right sides or the rear portion of the first housing 101; and a low voltage output terminal 131 protruding from the top or bottom surface of the second housing 102. The high voltage input terminal 121 is located on the left and right sides or the rear portion of the high voltage power unit 120 to facilitate the series connection of the units and insertion and removal of the power module. The low voltage output terminal 131 is located on the top or bottom surface of the low voltage power unit 130 to facilitate the parallel connection of the outputs and insertion and removal of the power module.

In one embodiment, the high voltage input terminal protrudes from the left and right sides or the rear portion of the body; the low voltage output terminal protrudes from the top or bottom surface of the body.

Other embodiments of the present disclosure will be apparent to those skilled in the art. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

It should be understood that the present disclosure is not limited to the precise structures that have been described above and shown in the drawings, and various modifications and changes can be made without departing from the scope thereof. The scope of the present disclosure is limited only by the appended claims.

What is claimed is:

1. A power conversion system, comprising:
   a power cabinet (200) comprising a first high voltage compartment (201) and a first low voltage compartment (202);

a first divider (210) arranged in the power cabinet (200) and extending along a height direction of the power cabinet (200) to separate the first high voltage compartment (201) and the first low voltage compartment (202); and a plurality of power modules (1) arranged in the power cabinet (200), each of the plurality of power modules (1) comprising a high voltage input terminal and a low voltage output terminal;

wherein the first divider (210) is provided with through holes (211) and the plurality of power modules pass through the through holes (211) to make the high voltage input terminal arranged in the first high voltage compartment (201), and the low voltage output terminal arranged in the first low voltage compartment (202);

wherein circumferential outer surfaces of the plurality of power modules (1) are sealed with hole walls of the through holes (211).

2. The power conversion system according to claim 1, further comprising:

input busbars (220) arranged in the first high voltage compartment (201) and electrically connected to the high voltage input terminals of the plurality of power modules (1); and output busbars (230) arranged in the first low voltage compartment (202) and electrically connected to the low voltage output terminals of the plurality of power modules (1).

3. The power conversion system according to claim 1, further comprising:

a plurality of isolation plates (240) arranged along the height direction of the power cabinet (200) and spaced from each other, wherein the plurality of isolation plates are arranged between the plurality of power modules (1) and a bottom of the power cabinet (200) and between the plurality of power modules (1) and a top of the power cabinet (200).

4. The power conversion system according to claim 3, wherein the power conversion system is a multi-phase power conversion system with the isolation plates (240) arranged between two adjacent power modules (1) of the plurality of power modules in different phases.

5. The power conversion system according to claim 3, wherein at least a part of each of the isolation plates (240) is located within the first high voltage compartment (201).

6. The power conversion system according to claim 3, wherein the isolation plates (240) are insulating plates.

7. The power conversion system according to claim 3, wherein the isolation plates are connected to the power cabinet (200) or the first divider (210).

8. The power conversion system according to claim 1, further comprising:

a system blower (250) arranged at a top of the power cabinet (200), wherein an air opening of the system blower (250) is in communication with the first high voltage compartment (201).

9. The power conversion system according to claim 1, further comprising:

an input-output cabinet (203) comprising a second high voltage compartment (204) and a second low voltage compartment (205);

a second divider (206) arranged in the input-output cabinet (203) and extending along a height direction of the input-output cabinet (203) to separate the second high voltage compartment (204) from the second low voltage compartment (205);

a system input portion (261) arranged in the second high voltage compartment (204);

a system output portion (262); and a control portion (260), wherein the system output portion (262) and the control portion (260) are arranged in the second low voltage compartment (205);

wherein the second high voltage compartment (204) is in communication with the first high voltage compartment (201).

10. The power conversion system according to claim 9, wherein the input-output cabinet (203) and the power cabinet (200) are spliced together, or integrally formed.

11. The power conversion system according to claim 9, wherein the second divider (206) and the first divider (210) are spliced together or integrally formed.

12. The power conversion system according to claim 1, wherein each of the plurality of power modules (1) further comprises:

a high voltage power unit (120, 20) comprising the high voltage input terminal;

a low voltage power unit (130, 30) comprising the low voltage output terminal;

a body (100, 10), wherein the high voltage power unit and the low voltage power unit are both arranged in the body; and a third divider (50, 110), wherein the high voltage power unit and the low voltage power unit are arranged at a first side and a second side of the third divider, respectively.

13. The power conversion system according to claim 12, wherein each of the plurality of power modules (1) further comprises:

a first air passage (11) and a second air passage (12) in the body (10) which are separated by the third divider (50), wherein the first air passage (11) and the second air passage (12) are continuous air passages and stacked;

a transformer (40) comprising a high voltage portion (41) and a low voltage portion (42), the high voltage portion (41) comprising a first magnetic core (411) and a high voltage coil (412) around the first magnetic core (411); and the low voltage portion (42) comprising a second magnetic core (421) and a low voltage coil (422) around the second magnetic core (421);

wherein the high voltage power unit (20) and the high voltage portion (41) are arranged in the first air passage (11), the low voltage power unit (30) and the low voltage portion (42) are arranged in the second air passage (12); and the high voltage coil (412) is electrically connected to the high voltage power unit (20), and the low voltage coil (422) is electrically connected to the low voltage power unit (30).

14. The power conversion system according to claim 13, wherein each of the plurality of power modules (1) further comprises:

a first modular blower (70), wherein an air opening of the first modular blower (70) is in communication with both a front portion of the first air passage (11) and a front portion of the second air passage (12).

15. The power conversion system according to claim 13, wherein the third divider (50) is a bent plate, and the high voltage power unit (20) and the low voltage power unit (30) are sequentially arranged along a length direction of the body (10).

16. The power conversion system according to claim 12, wherein the body (100) comprises a first housing (101) and a second housing (102) which are connected with each other along a length direction of the body (100);

wherein the first housing (101) is an insulating housing, the second housing (102) is a metal housing, and the high voltage power unit (120) and the low voltage power unit (130) are arranged in the first housing (101) and the second housing (102), respectively, and are arranged at the first side and the second side of the third divider (110), respectively.

17. The power conversion system according to claim 16, wherein each of the plurality of power modules (1) further comprises a transformer (140) which is electrically connected to the high voltage power unit (120) and the low voltage power unit (130);

wherein the transformer (140) and the high voltage power unit (120) are stacked, or the transformer (140) and the low voltage power unit (130) are stacked.

18. The power conversion system according to claim 16, wherein each of the plurality of power modules (1) further comprises:

a second modular blower (150) arranged at a side of the second housing (102) away from the first housing (101);

wherein an air opening of the second modular blower (150) is in communication with an interior of the second housing (102).

19. The power conversion system according to claim 12, wherein the high voltage input terminal protrudes from left and right sides of the body or a rear portion of the body; the low voltage output terminal protrudes from a top surface of the body or a bottom surface of the body.

\* \* \* \* \*